(12) United States Patent
Yamada et al.

(10) Patent No.: US 12,721,046 B2
(45) Date of Patent: Aug. 25, 2026

(54) DOMAIN WALL DISPLACEMENT ELEMENT, MAGNETIC ARRAY, AND METHOD OF MANUFACTURING DOMAIN WALL DISPLACEMENT ELEMENT

(71) Applicant: TDK CORPORATION, Tokyo (JP)

(72) Inventors: Shogo Yamada, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 418 days.

(21) Appl. No.: 18/271,550

(22) PCT Filed: Mar. 2, 2021

(86) PCT No.: PCT/JP2021/007951

§ 371 (c)(1),
(2) Date: Jul. 10, 2023

(87) PCT Pub. No.: WO2022/185410

PCT Pub. Date: Sep. 9, 2022

(65) Prior Publication Data

US 2024/0138267 A1 Apr. 25, 2024
US 2024/0237547 A9 Jul. 11, 2024

(51) Int. Cl.
*H10N 50/20* (2023.01)
*H10B 61/00* (2023.01)
(Continued)

(52) U.S. Cl.
CPC ............. *H10N 50/20* (2023.02); *H10B 61/00* (2023.02); *H10B 61/22* (2023.02); *H10N 50/01* (2023.02); *H10N 50/80* (2023.02)

(58) Field of Classification Search
CPC ........ H10N 50/20; H10N 50/01; H10N 50/80; H10N 50/10; H10B 61/00; H10B 61/22; G11B 5/676
See application file for complete search history.

(56) References Cited

U.S. PATENT DOCUMENTS

2012/0134199 A1* 5/2012 Zhu ....................... H01F 10/329 365/158
2012/0278582 A1 11/2012 Fukami et al.
(Continued)

FOREIGN PATENT DOCUMENTS

JP 2013-069906 A 4/2013
WO 2011/052475 A1 5/2011
(Continued)

OTHER PUBLICATIONS

Han et al., Control of offset field and pinning stability in perpendicular magnetic tunnelling junctions with synthetic antiferromagnetic coupling multilayer, J. Appl. Phys. 117, 17B515 (2015) (Year: 2015).*

(Continued)

*Primary Examiner* — Shih Tsun A Chou
(74) *Attorney, Agent, or Firm* — Oliff PLC

(57) ABSTRACT

A domain wall displacement element includes a magnetoresistance element which has a reference layer and a domain wall displacement layer each containing a ferromagnetic body, a non-magnetic layer, and first and second magnetization fixed layers which are in contact with the displacement layer, wherein the first layer has a first region in contact with the displacement layer, a non-magnetic first intermediate layer, and a second region contacting the first intermediate layer, the first region has a first ferromagnetic layer contacting the first intermediate layer, the second region has a second ferromagnetic layer contacting the first intermediate layer, the first and second ferromagnetic layers are ferromagnetically coupled, a ferromagnetic layer closest to the displacement layer in the first region and a ferromagnetic layer closest to displacement layer in the second magnetization fixed layer have the same film configuration, and the first and second regions are different in film configuration.

26 Claims, 20 Drawing Sheets

(51) Int. Cl.

| | |
|---|---|
| ***H10N 50/01*** | (2023.01) |
| ***H10N 50/80*** | (2023.01) |

(56) References Cited

U.S. PATENT DOCUMENTS

| | | | | |
|---|---|---|---|---|
| 2013/0075846 | A1 | 3/2013 | Suemitsu et al. | |
| 2016/0247550 | A1 | 8/2016 | Fukami et al. | |
| 2018/0301199 | A1* | 10/2018 | Sasaki | H10N 50/10 |
| 2021/0384415 | A1* | 12/2021 | Sun | H10N 50/10 |
| 2022/0051708 | A1 | 2/2022 | Yamada et al. | |

FOREIGN PATENT DOCUMENTS

| | | | |
|---|---|---|---|
| WO | 2015/068509 | A1 | 5/2015 |
| WO | 2020/230877 | A1 | 11/2020 |

OTHER PUBLICATIONS

Xu et al., Synthetic antiferromagnet with Heusler alloy Co2FeAl ferromagnetic layers, J. Appl. Phys. 106, 123902 (2009) (Year: 2009).*

Jun. 8, 2021 International Search Report issued in International Patent Application No. PCT/JP2021/007951.

* cited by examiner

200
CL
CL
100
SW1
SW2
SW3
WL
RL
WL
RL
WL
RL 200
90
Sub
w1
D
GI
G
S
w1
SW2 (Tr)
CL
40
RL
w1
w1
D
GI
G
S
w1
SW1 (Tr)
WL
w2
30
10
3
2
1
20
w2
x
z
y

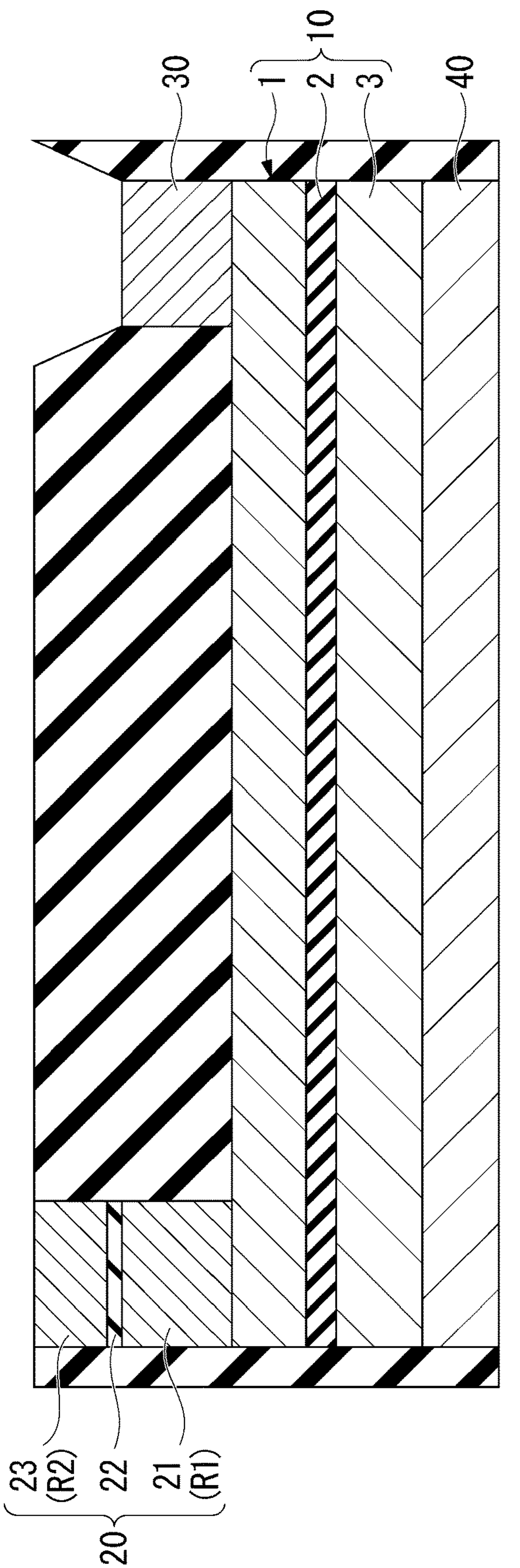
10
30
1
2
3
40
23
(R2)
22
21
(R1)
20
FIG. 7
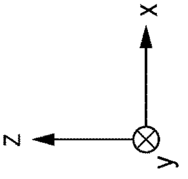
x
z
y 90
30
10
1
2
3
40
M30
42
90
Hex2
M21
M23
41
23 (R2)
22
21 (R1)
20
90
x
z
y 102
90
M30
30
10
1
2
3
40
42
MA2
A2
MA3b
M3
A3b
A3
A3a
DW
MA3a
A1
MA1
M23
41
23
25
23
25
23
22
21
(R1)
R2
20B
M21
90
z
x
y 103
90
30
10
1
2
3
40
M30
42
MA2
A2
90
MA3b
M3
DW
A3b
A3
A3a
MA3a
M21
A1
M23
MA1
41
23 (R2)
26B
26A
21 (R1)
26
20C
90
x
z
y 104
90
30A
33
32
31
10
1
2
3
40
M31
M33
42
MA2
A2
90
MA3b
M3
DW
A3b
A3
A3a
MA3a
M27
M29
A1
M23
MA1
41
23
(R2)
22
29
28
27
R1
20D
90
x
z
y 105
90
30B
35
34
10
1
2
3
40
M30
42
MA2
A2
90
MA3b
M3
DW
A3b
A3
A3a
MA3a
M21
A1
M23
MA1
41
23
(R2)
22
21
(R1)
20
90
x
z
y 106
90
30
10
1
2
3
40
M30
42A
MA2
A2
90
MA3b
M3
DW
A3b
A3a
A3
MA3a
M21
M23
41
A1
MA1
23 (R2)
22
21 (R1)
20
90
x
z
y 107
90
30
1A
10
2
3
40
M30
42
A2
MA2
h2
90
MA3b
h1
M3
DW
A3b
A3a
A3
MA3a
M21
A1
M23
MA1
41
23
(R2)
22
21
(R1)
20
90
x
z
y

FIG. 20

DOMAIN WALL DISPLACEMENT ELEMENT, MAGNETIC ARRAY, AND METHOD OF MANUFACTURING DOMAIN WALL DISPLACEMENT ELEMENT

TECHNICAL FIELD

The present disclosure relates to a domain wall displacement element, a magnetic array, and a method of manufacturing a domain wall displacement element.

BACKGROUND ART

Next-generation non-volatile memories that replace a flash memory and the like that have reached limits of miniaturization have attracted a lot of attention. For example, a magnetoresistive random access memory (MRAM), a resistive random access memory (ReRAM), a phase change random access memory (PCRAM), and the like are known as next-generation non-volatile memories.

MRAM uses a change in resistance value caused by a change in a direction of magnetization for data recording. Data recording is carried out by each of the magnetoresistance change elements constituting the MRAM. For example, Patent Document 1 describes a magnetoresistance element (a domain wall displacement element) capable of recording data with multiple-values by moving a domain wall in a first magnetization free layer (a domain wall displacement layer). Moreover, Patent Document 1 describes that a magnetization fixed region for limiting a movement range of the domain wall is provided at both ends of the first magnetization free layer (the domain wall displacement layer). The magnetization fixed regions provided at both ends have different magnetization orientation directions.

CITATION LIST

Patent Document

[Patent Document 1]
PCT International Publication No. WO 2011/052475

SUMMARY OF INVENTION

Technical Problem

The magnetization orientation direction of the magnetization fixed region is determined by, for example, applying an external magnetic field. However, a process of producing two magnetization fixed regions with different magnetization orientation directions is likely to be complicated because, when a magnetization of one magnetization fixed region is fixed, a magnetization of the other magnetization fixed region may be oriented in an unexpected direction.

The present disclosure has been made in view of the problems described above, and an object of the present disclosure is to provide a domain wall displacement element, a magnetic array, and a method of manufacturing a domain wall displacement element in which a magnetization orientation direction of a ferromagnetic layer can be easily determined.

Solution to Problem (1) A domain wall displacement element according to a first aspect includes a magnetoresistance element which has a reference layer and a domain wall displacement layer each containing a ferromagnetic body, and a non-magnetic layer between the reference layer and the domain wall displacement layer, and a first magnetization fixed layer and a second magnetization fixed layer which are each in direct or indirect contact with the domain wall displacement layer and are spaced apart from each other, in which the first magnetization fixed layer has a first region closest to the domain wall displacement layer, a non-magnetic first intermediate layer in contact with the first region, and a second region in contact with the first intermediate layer, the first region has a first ferromagnetic layer in contact with the first intermediate layer, the second region has a second ferromagnetic layer in contact with the first intermediate layer, the first ferromagnetic layer and the second ferromagnetic layer are ferromagnetically coupled, a ferromagnetic layer closest to the domain wall displacement layer in the first region and a ferromagnetic layer closest to the domain wall displacement layer in the second magnetization fixed layer have the same film configuration, and the first region and the second region are different in film configuration.

(2) In the domain wall displacement element according to the aspect described above, the first region may contain a plurality of ferromagnetic layers.

(3) In the domain wall displacement element according to the aspect described above, the second region may have a non-magnetic second intermediate layer and a plurality of ferromagnetic layers ferromagnetically coupled to each other with the second intermediate layer interposed therebetween.

(4) In the domain wall displacement element according to the aspect described above, the first intermediate layer and the second intermediate layer may be different in material or thickness.

(5) The domain wall displacement element according to the aspect described above may further include a plurality of second intermediate layers, in which any one of the first intermediate layer and the plurality of second intermediate layers may be different from the other layers in material or thickness.

(6) In the domain wall displacement element according to the aspect described above, the first intermediate layer may be made of a plurality of non-magnetic layers.

(7) In the domain wall displacement element according to the aspect described above, a thickness of the first intermediate layer may be 1 nm or more.

(8) In the domain wall displacement element according to the aspect described above, the first intermediate layer may be a discontinuous film interspersed with non-magnetic bodies, or may have openings.

(9) In the domain wall displacement element according to the aspect described above, the first intermediate layer may be an oxide or amorphous.

(10) In the domain wall displacement element according to the aspect described above, the second intermediate layer may be made of a plurality of non-magnetic layers.

(11) In the domain wall displacement element according to the aspect described above, a thickness of the second intermediate layer may be 1 nm or more.

(12) In the domain wall displacement element according to the aspect described above, the second intermediate layer may be a discontinuous film interspersed with non-magnetic bodies, or may also be configured to have openings.

(13) In the domain wall displacement element according to the aspect described above, the second intermediate layer may be an oxide or amorphous.

(14) In the domain wall displacement element according to the aspect described above, the first region may have a non-magnetic third intermediate layer, and a plurality of ferromagnetic layers antiferromagnetically coupled to each other with the third intermediate layer interposed therebetween.

(15) In the domain wall displacement element according to the aspect described above, a coercive force of the first region may be greater than a coercive force of the second region.

(16) In the domain wall displacement element according to the aspect described above, the first ferromagnetic layer and the second ferromagnetic layer may be coupled in a magnetostatic manner.

(17) In the domain wall displacement element according to the aspect described above, a magnetization orientation direction of a ferromagnetic layer constituting the second region may be different from a magnetization orientation direction of the reference layer.

(18) The domain wall displacement element according to the aspect described above may further include a first electrode in contact with the first magnetization fixed layer and a second electrode in contact with the second magnetization fixed layer, in which the first electrode and the second electrode may be different in shape.

(19) In the domain wall displacement element according to the aspect described above, the second electrode may cover a portion of a side surface of the second magnetization fixed layer.

(20) In the domain wall displacement element according to the aspect described above, the second electrode may have a peripheral length of a first surface in contact with the second magnetization fixed layer, which is shorter than a peripheral length of a second surface opposite to the first surface.

(21) In the domain wall displacement element according to the aspect described above, the second electrode may overlap a middle point of the domain wall displacement layer in a first direction in which the domain wall displacement layer extends, when viewed in a lamination direction.

(22) In the domain wall displacement element according to the aspect described above, an insulating layer covering a first side surface on the second magnetization fixed layer side of the first magnetization fixed layer and an insulating layer covering a second side surface on an opposite side to the first side surface may be different in material.

(23) In the domain wall displacement element according to the aspect described above, a thickness of the domain wall displacement layer may be thicker at a contact portion that is in direct or indirect contact with the first magnetization fixed layer or the second magnetization fixed layer than at an intermediary point of two of the contact portions.

(24) In the domain wall displacement element according to the aspect described above, the second magnetization fixed layer may have a non-magnetic fourth intermediate layer, and the fourth intermediate layer may contain the same materials as the first intermediate layer.

(25) The domain wall displacement element according to the aspect described above may further include a conductive layer in contact with a surface of the domain wall displacement layer, which is on an opposite side to the non-magnetic layer.

(26) A magnetic array according to a second aspect includes the plurality of domain wall displacement elements according to the aspect described above.

(27) A manufacturing method of a domain wall displacement element according to a third aspect includes a process of laminating a reference layer containing a ferromagnetic body, a non-magnetic layer, and a domain wall displacement layer containing a ferromagnetic body in order, a process of forming a laminated body in which a first layer containing a ferromagnetic body, a non-magnetic intermediate layer, and a second layer containing a ferromagnetic body are laminated in order on the domain wall displacement layer, a process of removing a part of the laminated body up to the domain wall displacement layer and forming two laminated bodies spaced apart from each other, and a process of removing at least the second layer of one of the two laminated bodies.

Advantageous Effects of Invention

The domain wall displacement element, the magnetic array, and the method of manufacturing a domain wall displacement element according to the aspects described above can easily determine a magnetization orientation direction of a ferromagnetic layer.

BRIEF DESCRIPTION OF DRAWINGS

FIG. 7 is a diagram for describing a method of manufacturing the domain wall displacement element according to the first embodiment.

FIG. 20 is a sectional view of a domain wall displacement element according to a modified example.

DESCRIPTION OF EMBODIMENTS

Figure 1:
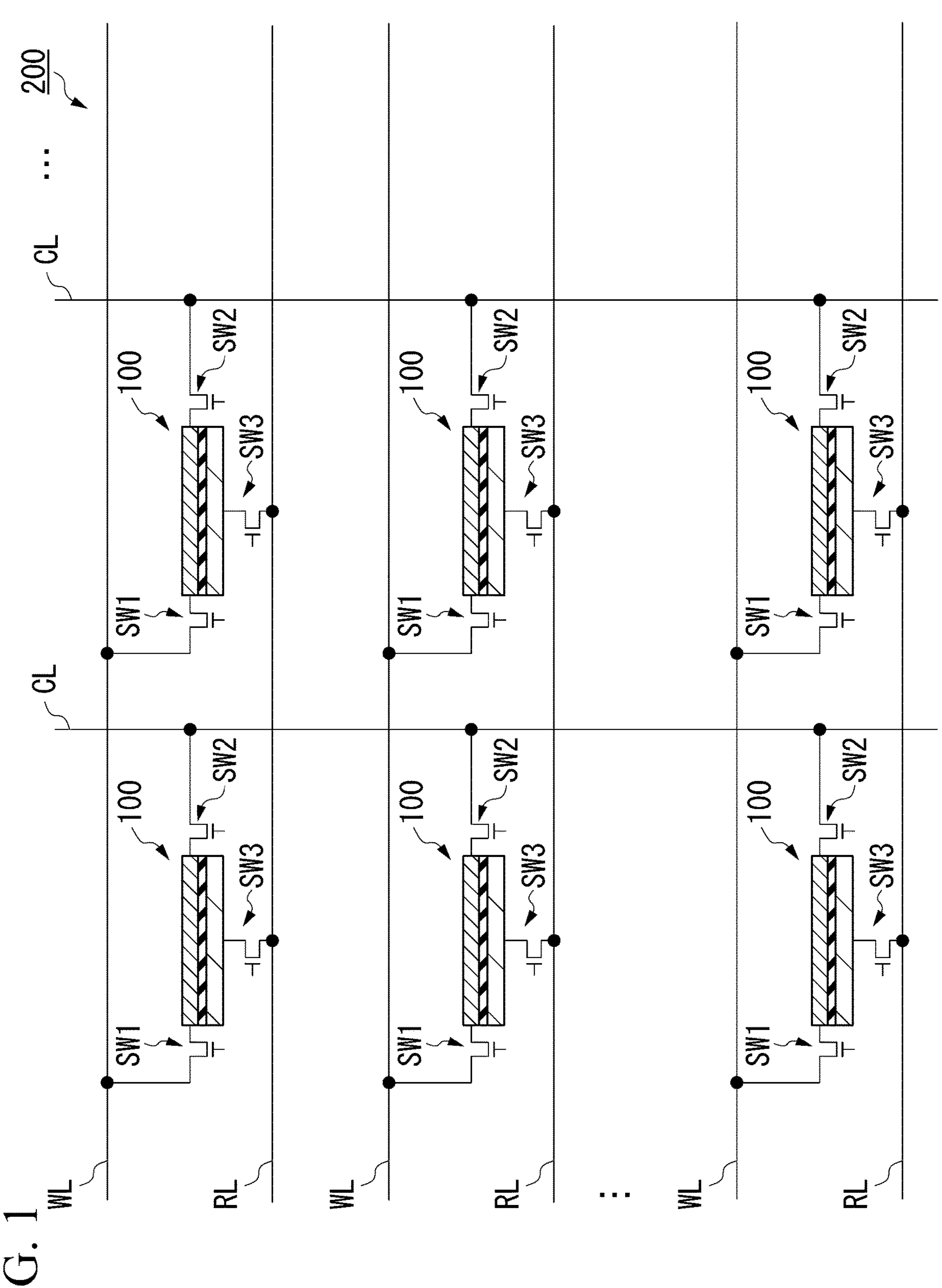
FIG. 1 is a configuration diagram of a magnetic array according to a first embodiment.

Hereinafter, the present embodiment will be described in detail with appropriate reference to the drawings. In the drawings used in the following description, there are cases where characteristic portions are enlarged and shown for convenience to make it easier to understand characteristics of the present disclosure, and dimensional ratios of respective components may be different from the actual ones. The materials, dimensions, and the like exemplified in the following description are examples, and the present disclosure is not limited to these, and can be implemented with appropriate changes within the scope of the present disclosure.

First, directions will be defined. An x direction and a y direction are directions substantially parallel to one surface of a substrate Sub (refer to FIG. 2), which will be described below. The x direction is a direction in which a domain wall displacement layer 1, which will be described below, extends. The x direction is an example of a first direction. The y direction is a direction perpendicular to the x direction. A z direction is a direction from a substrate Sub, which will be described below, toward the domain wall displacement element. In this specification, a +z direction may be expressed as "up" and a −z direction may be expressed as "down," but these expressions are for convenience and do not define a direction of gravity.

First Embodiment

FIG. 1 is a configuration diagram of a magnetic array according to a first embodiment. A magnetic array 200 includes a plurality of domain wall displacement elements 100, a plurality of first wirings WL, a plurality of second wirings CL, a plurality of third wirings RL, a plurality of first switching elements SW1, a plurality of second switching elements SW2, and a plurality of third switching elements SW3. The magnetic array 200 can be used in, for example, a magnetic memory, a sum-of-product operator, a neuromorphic device, a spin memristor, and a magneto-optical device.

Each of the first wirings WL is a write wiring. Each of the first wirings WL electrically connects a power supply and one or more domain wall displacement elements 100. The power supply is connected to one end of the magnetic array 200 when it is in use.

Each of the second wirings CL is a common wiring. A common wiring is a wiring that can be used both when data is written and when data is read. Each of the second wirings CL electrically connects a reference potential and one or more domain wall displacement elements 100. The reference potential is, for example, ground. The second wirings CL may be provided in each of the plurality of domain wall displacement elements 100, or may be provided over the plurality of domain wall displacement elements 100.

Each of the third wirings RL is a read wiring. The third wirings RL electrically connect a power source and one or more domain wall displacement elements 100. The power supply is connected to one end of the magnetic array 200 when it is in use.

In FIG. 1, each of the plurality of domain wall displacement elements 100 is connected to a first switching element SW1, a second switching element SW2, and a third switching element SW3. The first switching element SW1 is connected between the domain wall displacement element 100 and the first wiring WL. The second switching element SW2 is connected between the domain wall displacement element 100 and the second wiring CL. The third switching element SW3 is connected between the domain wall displacement element 100 and the third wiring RL.

When the first switching element SW1 and the second switching element SW2 are turned on, a write current flows between a first wiring WL and a second wiring CL that are connected to a predetermined domain wall displacement element 100. When the second switching element SW2 and the third switching element SW3 are turned on, a read current flows between a second wiring CL and a third wiring RL connected to the predetermined domain wall displacement element 100.

The first switching element SW1, the second switching element SW2, and the third switching element SW3 are elements that control a current flow. The first switching element SW1, the second switching element SW2, and the third switching element SW3 are, for example, transistors, elements that use a phase change of a crystal layer such as ovonic threshold switches (OTS), elements that use a band structure change such as metal insulator transition (MIT) switches, elements that use a breakdown voltage such as Zener diodes and avalanche diodes, or elements whose conductivity changes with changes in atomic positions.

Any one of the first switching element SW1, the second switching element SW2, and the third switching element SW3 may be shared by the domain wall displacement element 100 connected to the same wiring. For example, when the first switching element SW1 is shared, one first switching element SW1 is provided upstream (one end) of the first wiring WL. For example, when the second switching element SW2 is shared, one second switching element SW2 is provided upstream (one end) of the second wiring CL. For example, when the third switching element SW3 is shared, one third switching element SW3 is provided upstream (one end) of the third wiring RL.

Figure 2:
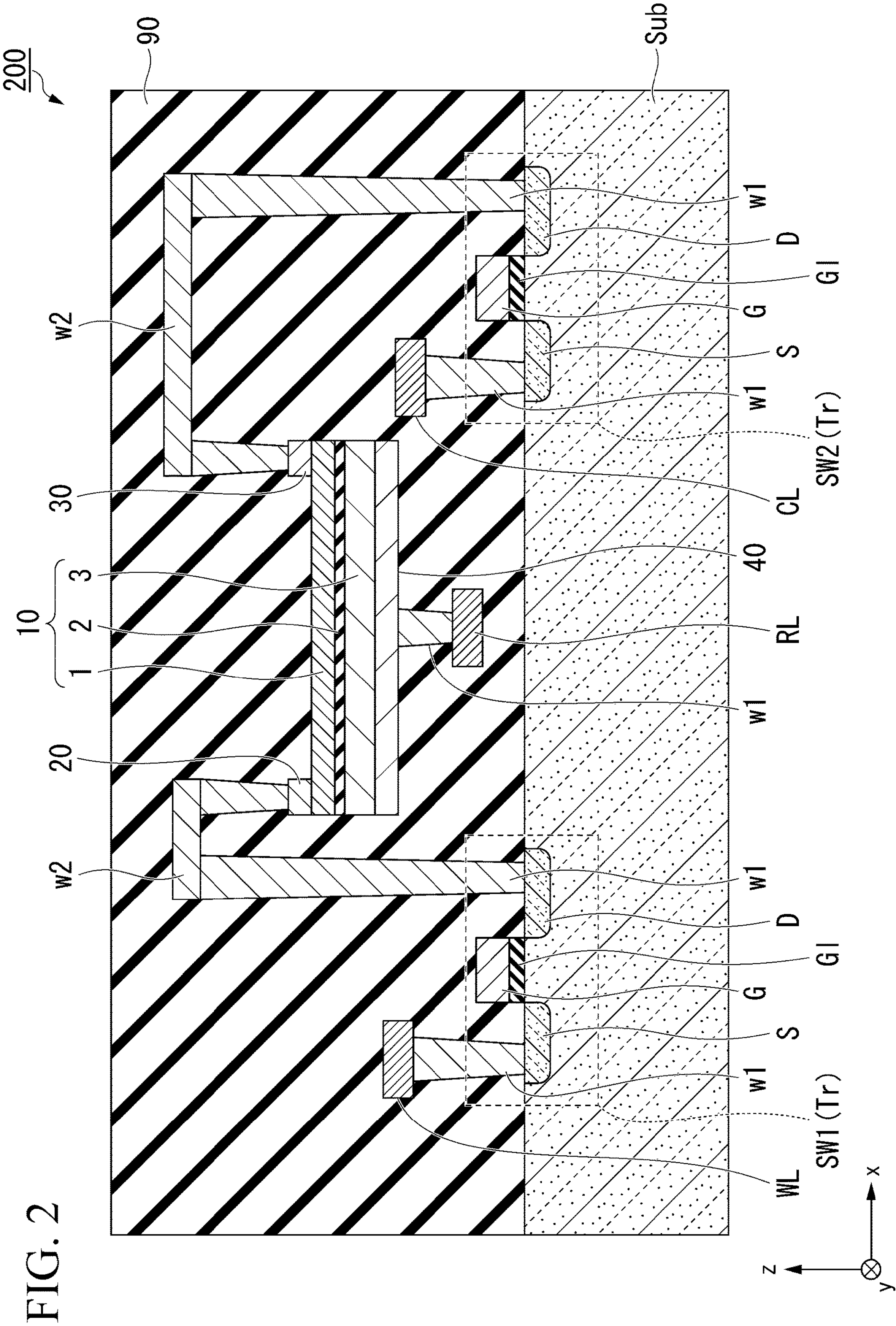
FIG. 2 is a sectional view of a vicinity of a domain wall displacement element of the magnetic array according to the first embodiment.

FIG. 2 is a sectional view in a vicinity of the domain wall displacement element 100 of the magnetic array 200 according to the first embodiment. FIG. 2 is a cross section of one domain wall displacement element 100 in FIG. 1, which is taken along an xz plane passing through a center of a width of the domain wall displacement layer 1 in the y direction.

The first switching element SW1 and the second switching element SW2 shown in FIG. 2 are transistors Tr. A transistor Tr has a gate electrode G, a gate insulating film GI, and a source S and a drain D formed on a substrate Sub. The source S and the drain D are predetermined depending on a direction of a current flow and are both active regions. FIG. 2 only shows an example, and a positional relationship between the source S and the drain D may be reversed. The substrate Sub is, for example, a semiconductor substrate. The third switching element SW3 is electrically connected to the third wiring RL and is, for example, at a position shifted in the y direction in FIG. 2.

Each of the transistors Tr and the domain wall displacement element 100 are electrically connected via wirings w1 and w2. The wirings w1 and w2 contain materials with conductivity. A wiring w1 is a via wiring extending in a z-direction. A wiring w2 is an in-plane wiring that extends in any one direction in an xy plane. The wirings w1 and w2 are formed in openings of an insulating layer 90.

The insulating layer 90 is an insulating layer that insulates between wirings of multilayer wirings and between elements. The domain wall displacement element 100 and the transistors Tr are electrically separated by the insulating layer 90 except for the wirings w1 and w2. The insulating layer 90 is, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), magnesium oxide (MgO), and the like.

Although FIG. 2 has shown an example in which the domain wall displacement element 100 is above the substrate Sub with the insulating layer 90 interposed therebetween, the domain wall displacement element 100 may be on the substrate Sub.

[Domain Wall Displacement Element]

Figure 3:
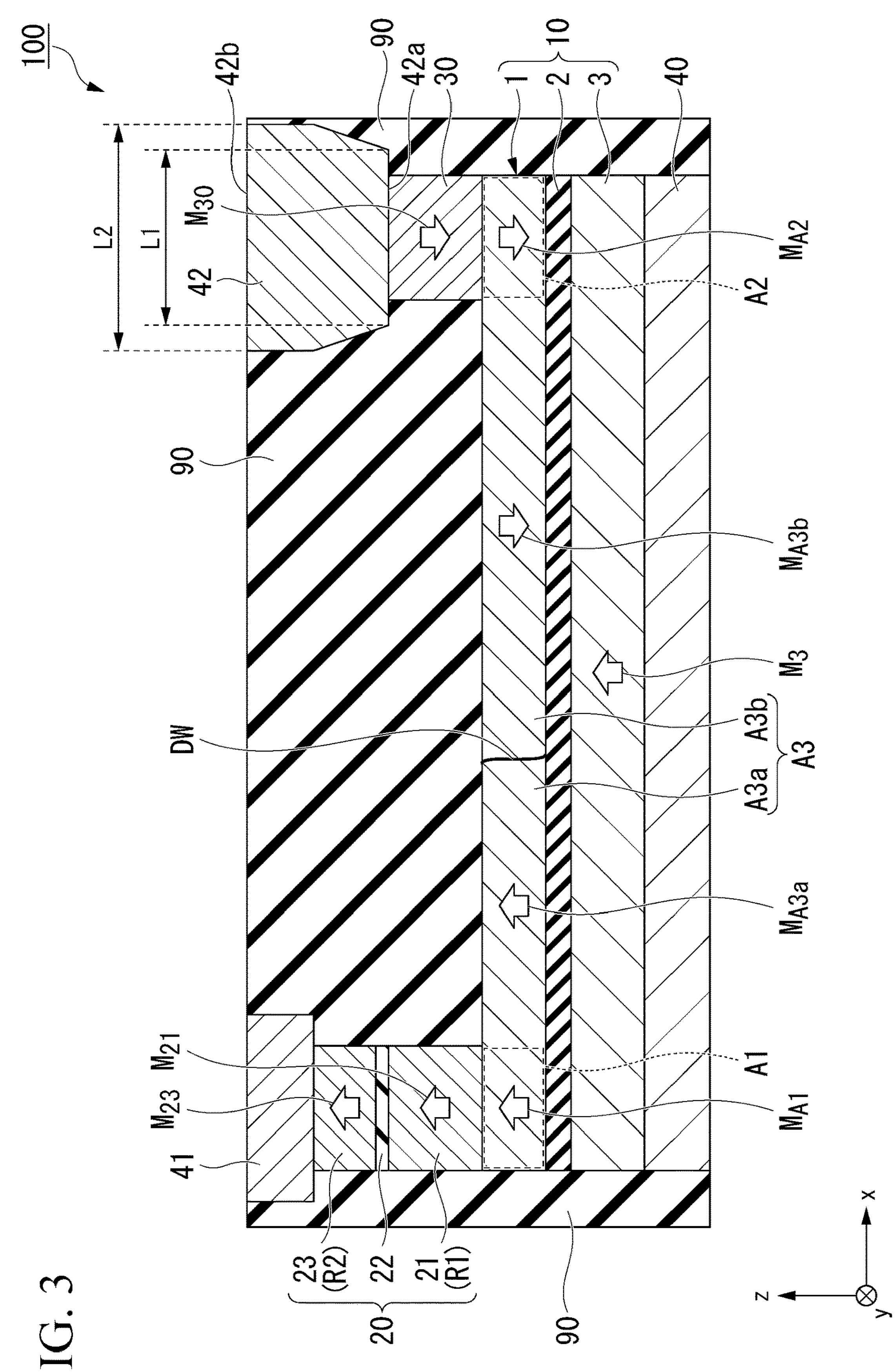
FIG. 3 is a sectional view of the domain wall displacement element according to the first embodiment.
Figure 4:
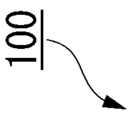
FIG. 4 is a plan view of the domain wall displacement element according to the first embodiment.
Figure 4:
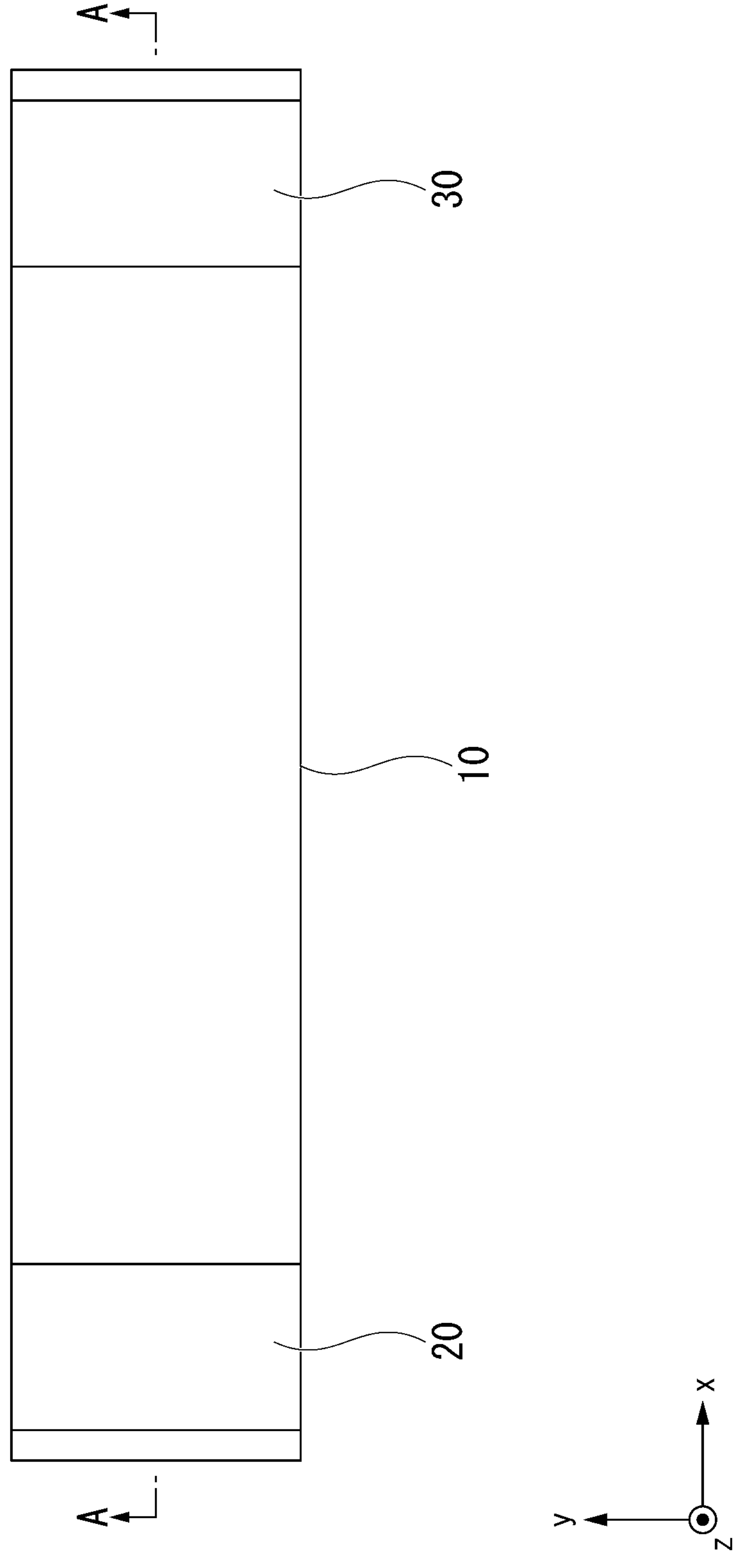

FIG. 3 is a sectional view of the domain wall displacement element 100 taken along the xz plane passing through the center of the domain wall displacement layer 1 in the y direction. FIG. 3 is a cross section along line A-A in FIG. 4. FIG. 4 is a plan view of the domain wall displacement element 100 viewed in a z direction. An arrow shown in FIG. 4 is an example of a magnetization orientation direction of a ferromagnetic body.

The domain wall displacement element 100 has, for example, a magnetoresistance element 10, a first magnetization fixed layer 20, and a second magnetization fixed layer 30. The domain wall displacement element 100 is, for example, a three terminal type element connected to three electrodes 40, 41, and 42. Surroundings of the domain wall displacement element 100 are covered with the insulating layer 90.

The magnetoresistance element 10 includes a domain wall displacement layer 1, a non-magnetic layer 2, and a reference layer 3. The magnetoresistance element 10 includes, for example, the reference layer 3, the non-magnetic layer 2, and the domain wall displacement layer 1 in this order from a side closer to the substrate Sub. A write current flows along the domain wall displacement layer 1 when data is written to the magnetoresistance element 10. When data is read from the magnetoresistance element 10, a read current flows between an electrode 40 and an electrode 41 or an electrode 42 to apply a current to the magnetoresistance element 10 in the z direction.

The domain wall displacement layer 1 extends in the x direction. The domain wall displacement layer 1 has a plurality of magnetic domains inside and a domain wall DW at boundaries of the plurality of magnetic domains. The domain wall displacement layer 1 is, for example, a layer on which information can be magnetically recorded by changing the magnetic state. The domain wall displacement layer 1 may be called an analog layer or a magnetic recording layer in some cases.

The domain wall displacement layer 1 has a magnetization fixed region A1, a magnetization fixed region A2, and a domain wall displacement region A3. The magnetization fixed region A1 is a region that overlaps the first magnetization fixed layer 20 when viewed in the z direction. The magnetization fixed region A2 is a region that overlaps the second magnetization fixed layer 30 when viewed in the z direction. The domain wall displacement region A3 is a region of the domain wall displacement layer 1 other than the magnetization fixed region A1 and the magnetization fixed region A2. The domain wall displacement region A3 is, for example, a region interposed between the magnetization fixed region A1 and the magnetization fixed region A2 in the x direction.

Magnetization $M_{A1}$ of the magnetization fixed region A1 is fixed by magnetization $M_{21}$ of the first magnetization fixed layer 20. Magnetization $M_{A2}$ of the magnetization fixed region A2 is fixed by magnetization $M_{30}$ of the second magnetization fixed layer 30. The fixation of magnetization means that the magnetization does not reverse during a normal operation of the domain wall displacement element 100 (without an external force beyond assumption being applied). The magnetization $M_{A1}$ of the magnetization fixed region A1 and the magnetization $M_{A2}$ of the magnetization fixed region A2 are, for example, opposite in orientation direction.

The domain wall displacement region A3 is a region in which a direction of magnetization changes and the domain wall DW can move. The domain wall displacement region A3 has a first magnetic domain A3*a* and a second magnetic domain A3*b*. Magnetization $M_{A3a}$ of the first magnetic domain A3*a* and magnetization $M_{A3b}$ of the second magnetic domain A3*b* are, for example, opposite in orientation direction. The boundary between the first magnetic domain A3*a* and the second magnetic domain A3*b* is the domain wall DW. The magnetization $M_{A3a}$ of the first magnetic domain A3*a* is, for example, oriented in the same direction as the magnetization $M_{A1}$ of the magnetization fixed region A1. The magnetization $M_{A3b}$ of the second magnetic domain A3*b* is, for example, oriented in the same direction as the magnetization $M_{A2}$ of the magnetization fixed region A2. In principle, the domain wall DW moves within the domain wall displacement region A3 and does not enter the magnetization fixed region A1 and the magnetization fixed region A2.

When a volume ratio of the first magnetic domain A3*a* and the second magnetic domain A3*b* in the domain wall displacement region A3 changes, the domain wall DW moves. The domain wall DW moves by applying a write current to the domain wall displacement region A3 in the x direction. For example, when a write current (for example, a current pulse) is applied to the domain wall displacement region A3 in a +x direction, the electrons flow in a −x direction opposite to the current, so that the domain wall DW moves in the −x direction. When a current flows from the first magnetic domain A3*a* toward the second magnetic domain A3*b*, electrons spin-polarized in the second magnetic domain A3*b* reverse the magnetization of the first magnetic domain A3*a*. The magnetization of the first magnetic domain A3*a* reverses, and thereby the domain wall DW moves in the −x direction.

The domain wall displacement layer 1 contains a magnetic body. The domain wall displacement layer 1 may be a ferromagnetic body, a ferrimagnetic body, or a combination of these and an antiferromagnetic body capable of changing the magnetic state by a current. It is preferred that the domain wall displacement layer 1 have at least one element selected from a group consisting of Co, Ni, Fe, Pt, Pd, Gd, Tb, Mn, Ge, and Ga. Examples of the material used for the domain wall displacement layer 1 include, for example, a laminated film of Co and Ni, a laminated film of Co and Pt, a laminated film of Co and Pd, a laminated film of CoFe and Pd, an MnGa-based material, a GdCo-based material, and a TbCo-based material. A ferrimagnetic body such as the MnGa-based material, the GdCo-based material, and the TbCo-based material has small saturation magnetization and a small threshold current required to move the domain wall DW. In addition, the laminated film of Co and Ni, the laminated film of Co and Pt, and the laminated film of Co and Pd have a large coercive force, and a slow moving speed of the domain wall DW. The anti-ferromagnetic body is, for example, $Mn_3X$ (where X is Sn, Ge, Ga, Pt, Ir, or the like), CuMnAs, $Mn_2Au$, or the like. The domain wall displacement layer 1 can also be made by applying the same materials as those of the reference layer 3 to be described below.

The non-magnetic layer 2 is positioned between the domain wall displacement layer 1 and the reference layer 3. The non-magnetic layer 2 is laminated on one surface of the reference layer 3.

The non-magnetic layer 2 is made of, for example, a non-magnetic insulating material, a semiconductor, or a metal. Examples of the non-magnetic insulating material include, for example, $Al_2O_3$, $SiO_2$, MgO, $MgAl_2O_4$, and materials in which some of Al, Si, and Mg of these are replaced with Zn, Be, and the like. These materials have a large bandgap and excellent insulation properties. When the non-magnetic layer 2 is made of the non-magnetic insulating material, the non-magnetic layer 2 is a tunnel barrier layer. Non-magnetic metals are, for example, Cu, Au, Ag, and the like. Non-magnetic semiconductors are, for example, Si, Ge, $CuInSe_2$, $CuGaSe_2$, $Cu(In,Ga)Se_2$, and the like.

A thickness of the non-magnetic layer 2 is, for example, 20 Å or more, and may be 25 Å or more. When the thickness of the non-magnetic layer 2 becomes larger, a resistance area product (RA) of the domain wall displacement element 100 increases. The resistance area product (RA) of the domain wall displacement element 100 is preferably $1\times10^4$ $\Omega\mu m^2$ or more, and is more preferably $5\times10^4$ $\Omega\mu m^2$ or more. The resistance area product (RA) of the domain wall displacement element 100 is expressed by a product of an element resistance of one domain wall displacement element 100 and an element cross-sectional area of the domain wall displacement element 100 (an area of a cross section of the non-magnetic layer 2 taken along the xy plane).

The reference layer 3, together with the domain wall displacement layer 1, interposes the non-magnetic layer 2 therebetween. The reference layer 3 is, for example, on the electrode 40. The reference layer 3 may also be laminated on the substrate Sub. The reference layer 3 is positioned to overlap the domain wall displacement layer 1 in the z direction. Magnetization $M_3$ of the reference layer 3 is more difficult to reverse than magnetizations $M_{A3a}$ and $M_{A3b}$ of the domain wall displacement region A3 of the domain wall displacement layer 1. The magnetization $M_3$ of the reference layer 3 does not change the direction and is fixed when an external force is applied to an extent that the magnetizations $M_{A3a}$ and $M_{A3b}$ of the domain wall displacement region A3 are reversed. The reference layer 3 may be called a magnetization fixed layer in some cases. The reference layer 3 may be made of a plurality of layers. For example, it may have a plurality of ferromagnetic layers and an intermediate layer interposed between the plurality of ferromagnetic layers. Two ferromagnetic layers interposing the intermediate layer therebetween may be magnetically coupled to form a synthetic antiferromagnetic structure (SAF).

The reference layer 3 contains a ferromagnetic body. The reference layer 3 contains, for example, a material that facilitates obtaining a coherent tunnel effect between itself and the domain wall displacement layer 1. The reference layer 3 contains, for example, a metal selected from a group consisting of Cr, Mn, Co, Fe, and Ni, an alloy containing one or more of these metals, an alloy containing these metals and at least one element of B, C, and N, and the like. The reference layer 3 is, for example, Co—Fe, Co—Fe—B, or Ni—Fe.

The reference layer 3 may be, for example, a Heusler alloy. A Heusler alloy is a half-metal and has high spin polarization. The Heusler alloy is an intermetallic compound having a chemical composition of XYZ or $X_2YZ$, where X is a transition metal element or a noble metal element of a Co, Fe, Ni, or Cu group on a periodic table, Y is a transition metal of a Mn, V, Cr, or Ti group or an elemental species of X, and Z is a typical element of groups III to V. Examples of the Heusler alloy include, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

The first magnetization fixed layer 20 and the second magnetization fixed layer 30 are directly or indirectly connected to the domain wall displacement layer 1. Being indirectly connected means interposing another layer between the first magnetization fixed layer 20 and the domain wall displacement layer 1 and between the second magnetization fixed layer 30 and the domain wall displacement layer 1. The first magnetization fixed layer 20 and the second magnetization fixed layer 30 are, for example, on the domain wall displacement layer 1. The first magnetization fixed layer 20 and the second magnetization fixed layer 30 are spaced apart from each other in the x direction. The first magnetization fixed layer 20 fixes the magnetization $M_{A1}$ of the magnetization fixed region A1. The second magnetization fixed layer 30 fixes the magnetization $M_{A2}$ of the magnetization fixed region A2.

The first magnetization fixed layer 20 has a first region R1, an intermediate layer 22, and a second region R2. The first region R1 is closest to the domain wall displacement layer 1. The first region R1 is, for example, in contact with the domain wall displacement layer 1. The intermediate layer 22 is interposed between the first region R1 and the second region R2. The second region R2 is in contact with the intermediate layer 22. The intermediate layer 22 is an example of a first intermediate layer.

For example, as shown in FIG. 3, the first region R1 is made of a ferromagnetic layer 21, and the second region R2 is made of a ferromagnetic layer 23. The ferromagnetic layer 21 is closest to the domain wall displacement layer 1. The ferromagnetic layer 21 is, for example, in contact with the domain wall displacement layer 1. The ferromagnetic layer 21 is, for example, in contact with the intermediate layer 22. The ferromagnetic layer 21 is an example of a first ferromagnetic layer. The ferromagnetic layer 23 is, for example, in contact with the intermediate layer 22. The ferromagnetic layer 23 is an example of a second ferromagnetic layer. The first region R1 and the second region R2 are different in film configuration. The film configuration includes a film thickness, a material, a composition, a lamination order of layers constituting each region, and the like. A coercive force of the first region R1 is, for example, greater than a coercive force of the second region R2.

The two ferromagnetic layers 21 and 23 that are in contact with the intermediate layer 22 and interpose the intermediate layer 22 therebetween are ferromagnetically coupled. For this reason, an orientation direction of magnetization $M_{21}$ of the ferromagnetic layer 21 and an orientation direction of magnetization $M_{23}$ of the ferromagnetic layer 23 match each other. Ferromagnetic coupling may be interlayer exchange coupling or magnetostatic coupling. When the ferromagnetic coupling is magnetostatic coupling, the magnetizations $M_{21}$ and $M_{23}$ are highly stable because they are hardly affected by a state of an interface between the ferromagnetic layer 21, the ferromagnetic layer 23, and the intermediate layer 22.

Materials constituting the ferromagnetic layer 21 and the ferromagnetic layer 23 are the same as those of the reference layer 3 described above or the domain wall displacement layer 1 described above. The ferromagnetic layer 21 and ferromagnetic layer 23 may be multilayer films. The ferromagnetic layer 21 and the ferromagnetic layer 23 are different in, for example, film thickness, material, or composition.

The intermediate layer 22 is a non-magnetic body. Materials constituting the intermediate layer 22 are, for example, the same as those of the non-magnetic layer 2 described above. The intermediate layer 22 includes, for example, any one selected from a group consisting of MgO, Mg—Al—O, Mg, W, Mo, Ta, Pd, and Pt.

The intermediate layer 22 is, for example, an oxide. Oxides are generally harder than metals and difficult to be processed. The intermediate layer 22 is the same as a layer that is formed on the second magnetization fixed layer 30 at the time of manufacturing, as will be described in detail below. If the layer is hard, it can serve as a stopper when the second magnetization fixed layer 30 is processed, and can curb the second magnetization fixed layer 30 from being etching damaged.

In addition, the intermediate layer 22 may also be amorphous. Oxides and amorphous materials have high resistance and generate heat when a current is applied. When the intermediate layer 22 generates heat, the magnetizations $M_{21}$ and $M_{23}$ of the adjacent ferromagnetic layers 21 and 23 are disturbed, and a leakage magnetic field generated from the first magnetization fixed layer 20 becomes smaller. The leakage magnetic field from the first magnetization fixed layer 20 and the second magnetization fixed layer 30 is canceled in a central portion of the domain wall displacement layer 1 in the x direction when saturation magnetization of the first magnetization fixed layer 20 and saturation magnetization of the second magnetization fixed layer 30 match each other. However, when there is a difference between the saturation magnetization of the entire first magnetization fixed layer 20 and the saturation magnetization of the entire second magnetization fixed layer 30, the leakage magnetic field also occurs in the central portion of the domain wall displacement layer 1 in the x direction. The leakage magnetic field can be a cause for disturbing a behavior of the domain wall DW.

A thickness of the intermediate layer 22 is, for example, 1 nm or more. If the thickness of the intermediate layer 22 is sufficiently thick, a roughness of the ferromagnetic layer 23 is reduced. In addition, a distance between the ferromagnetic layer 23 and the domain wall displacement layer 1 is increased, and an influence of a leakage magnetic field from the ferromagnetic layer 23 on the domain wall displacement layer 1 is reduced.

On the other hand, the thickness of the intermediate layer 22 may be sufficiently thin. For example, the thickness of the intermediate layer 22 may be at an atomic layer level, and the intermediate layer 22 may not constitute a complete layer. For example, the intermediate layer 22 may be a discontinuous film interspersed with non-magnetic bodies, or may have an opening. If there is a discontinuous portion in part of the intermediate layer 22, the ferromagnetic layer 21 and the ferromagnetic layer 23 are partially in contact with each other, and a resistance value of the entire first magnetization fixed layer 20 is lowered. When the resistance value of the entire first magnetization fixed layer 20 is lowered, a voltage required for domain wall displacement when a write current is applied to the domain wall displacement layer 1 through the first magnetization fixed layer 20 is reduced.

The second magnetization fixed layer 30 is made of a ferromagnetic layer. The second magnetization fixed layer 30 is closest to the domain wall displacement layer 1. The second magnetization fixed layer 30 is, for example, in contact with the domain wall displacement layer 1. The second magnetization fixed layer 30 has the same film configuration as the ferromagnetic layer 21 of the first region R1. Although details will be described below, the second magnetization fixed layer 30 and the ferromagnetic layer 21 are layers formed at the same time.

An orientation direction of the magnetization $M_{30}$ of the second magnetization fixed layer 30 is opposite to the orientation direction of the magnetizations $M_{21}$ and $M_{23}$ of the ferromagnetic layers 21 and 23 of the first region R1.

The electrode 40 is connected to the reference layer 3. The electrode 41 is connected to the first magnetization fixed layer 20. The electrode 41 is an example of a first electrode. The electrode 42 is connected to the second magnetization fixed layer 30. The electrode 42 is an example of a second electrode. The electrodes 40, 41, and 42 contain materials having conductivity.

The electrodes 41 and 42 are different in shape. A volume of the electrode 42 is larger than that of the electrode 41. The electrode 42 is connected to, for example, the second wiring CL which is a common wiring. The second wiring CL is used both when data is written and when data is read, and the volume of the electrode 42 increases and resistance decreases, thereby reducing parasitic resistance. A peripheral length L1 of a first surface 42*a* of the electrode 42 in contact with the second magnetization fixed layer 30 is, for example, shorter than a peripheral length L2 of a second surface 42*b* opposite to the first surface 42*a*. When the electrode 42 has this shape, a current flows along side surfaces of the electrode 42 and the current flows smoothly.

A direction of magnetization of each layer of the domain wall displacement element 100 can be confirmed by, for example, measuring a magnetization curve. The magnetization curve can be measured using, for example, a magneto optical Kerr effect (MOKE). Measurement by MOKE is a measurement method that is performed by causing linearly polarized light to be incident on an object to be measured, and using a magneto-optical effect (magnetic Kerr effect) that causes a rotation in a polarization direction and the like.

Next, a method of manufacturing the domain wall displacement element 100 will be described. The domain wall displacement element 100 has a first lamination process, a second lamination process, a first processing process, a second processing process, and a magnetization fixing process. FIGS. 5 to 9 are diagrams for describing the method of manufacturing the domain wall displacement element 100 according to the first embodiment.

First, in the first lamination process, the reference layer 3 containing a ferromagnetic body, the non-magnetic layer 2, and the domain wall displacement layer 1 containing a ferromagnetic body are sequentially laminated. For lamination of each layer, a sputtering method, a chemical vapor deposition (CVD) method, an electron beam vapor deposition method (an EB vapor deposition method), an atomic laser deposition method, or the like can be used.

Figure 5:
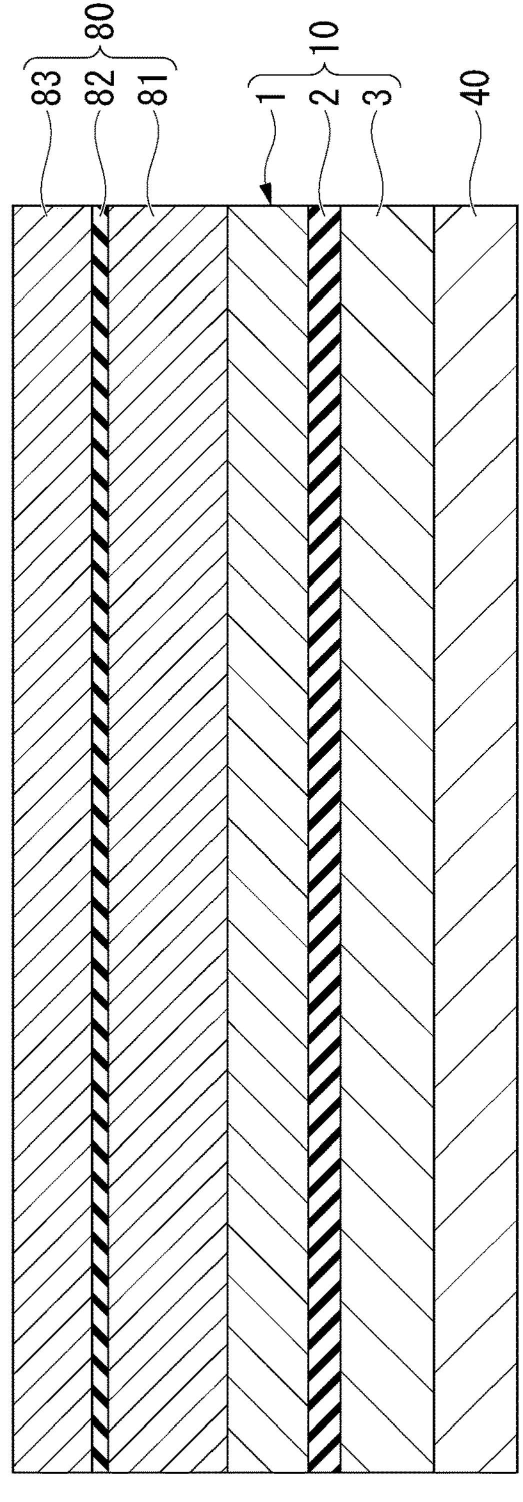
FIG. 5 is a diagram for describing a method of manufacturing the domain wall displacement element according to the first embodiment.
Figure 5:
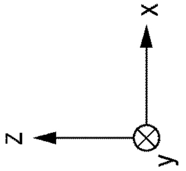

Next, as shown in FIG. 5, as a second lamination process, a first layer 81 containing a ferromagnetic body, a non-magnetic intermediate layer 82, and a second layer 83 containing a ferromagnetic body are sequentially laminated on the domain wall displacement layer 1. By laminating these layers, a laminated body 80 having the first layer 81, the intermediate layer 82, and the second layer 83 is formed. A method of laminating each layer is the same as the first lamination process.

Figure 6:
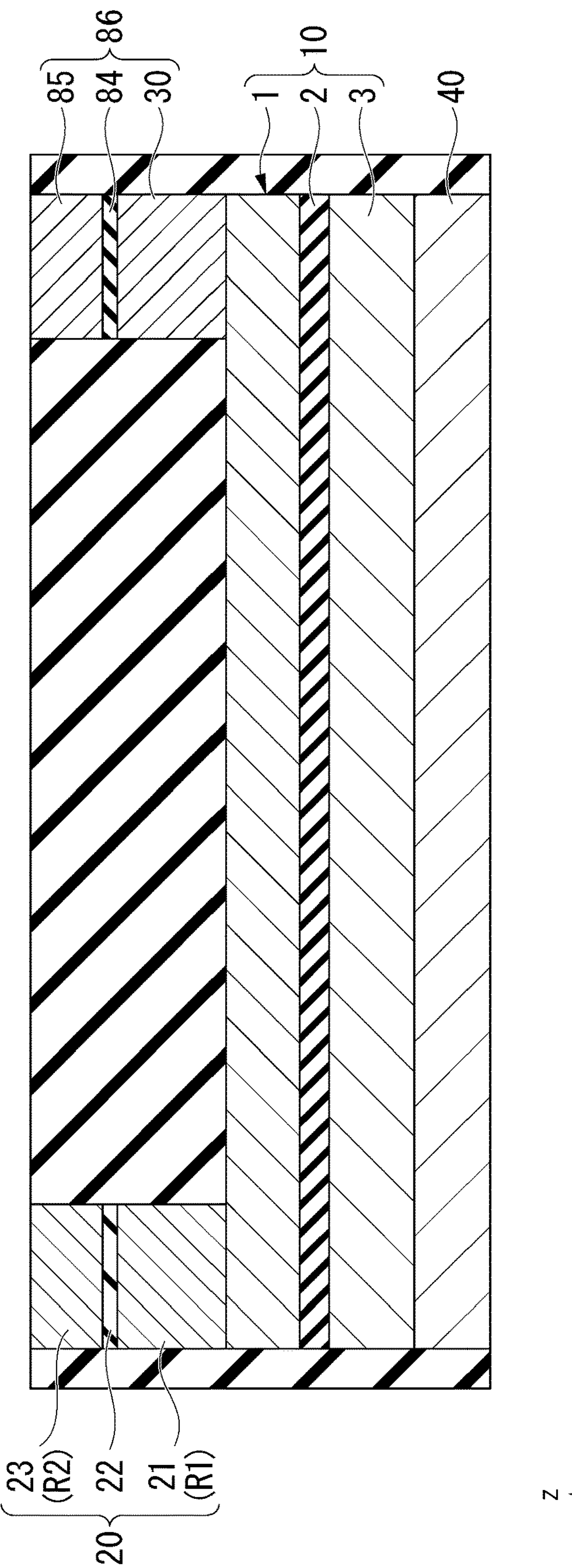
FIG. 6 is a diagram for describing a method of manufacturing the domain wall displacement element according to the first embodiment.
Figure 6:

Then, as shown in FIG. 6, as a first processing process, a part of the laminated body 80 is removed up to the domain wall displacement layer 1. Processing can be performed using photolithography, etching (for example, Ar etching), and the like. A part of the laminated body 80 is removed, thereby the first magnetization fixed layer 20 and a laminated body 86 spaced apart from each other are formed on the domain wall displacement layer 1. The laminated body 86 is made of a second magnetization fixed layer 30, an intermediate layer 84, and a ferromagnetic layer 85.

Then, as shown in FIG. 7, as a second processing process, at least the ferromagnetic layer 85 of the laminated body 86 is removed. The intermediate layer 84 is more difficult to be etched than the ferromagnetic layer 85. The intermediate layer 84 prevents the second magnetization fixed layer 30 from being etched by the etching in the second processing process. As a result, a constant volume of the second magnetization fixed layer 30 remains, and the second magnetization fixed layer 30 exhibits a coercive force equal to or greater than a predetermined value.

Next, the electrodes 41 and 42 are formed. The electrode 41 is formed on the first magnetization fixed layer 20. The electrode 42 is obtained by filling an opening formed in the second processing process with a conductor and laminating conductive layers.

Figure 8:
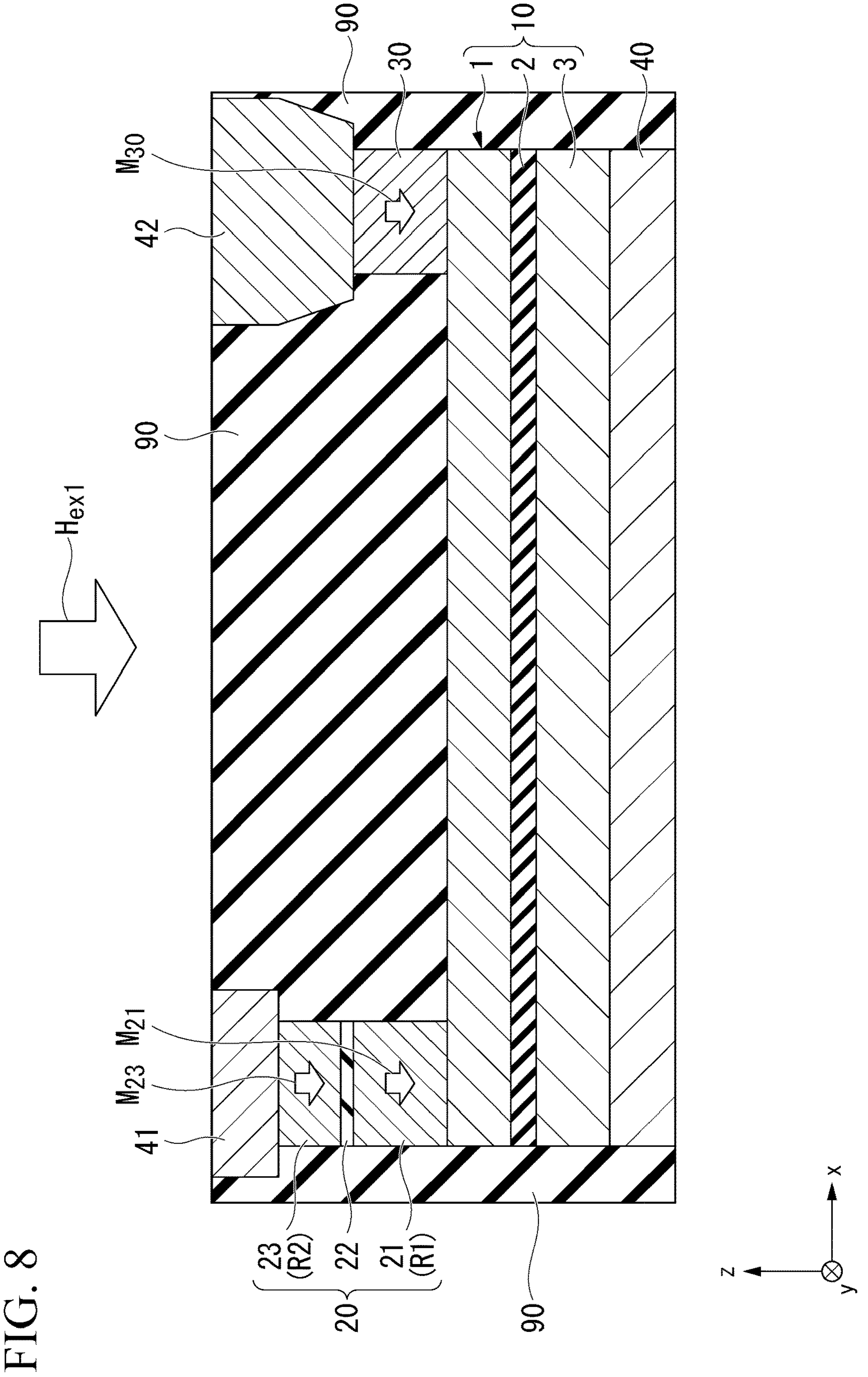
FIG. 8 is a diagram for describing a method of manufacturing the domain wall displacement element according to the first embodiment.

Next, as shown in FIG. 8, a magnetization fixing process is performed on a produced domain wall displacement element 100. First, an external magnetic field $H_{ex1}$ is applied to the domain wall displacement element 100 in one direction (for example, −z direction). The magnetizations $M_{21}$, $M_{23}$, and $M_{30}$ of each layer are oriented in a direction in which the external magnetic field $H_{ex1}$ is applied (for example, −z direction).

Figure 9:
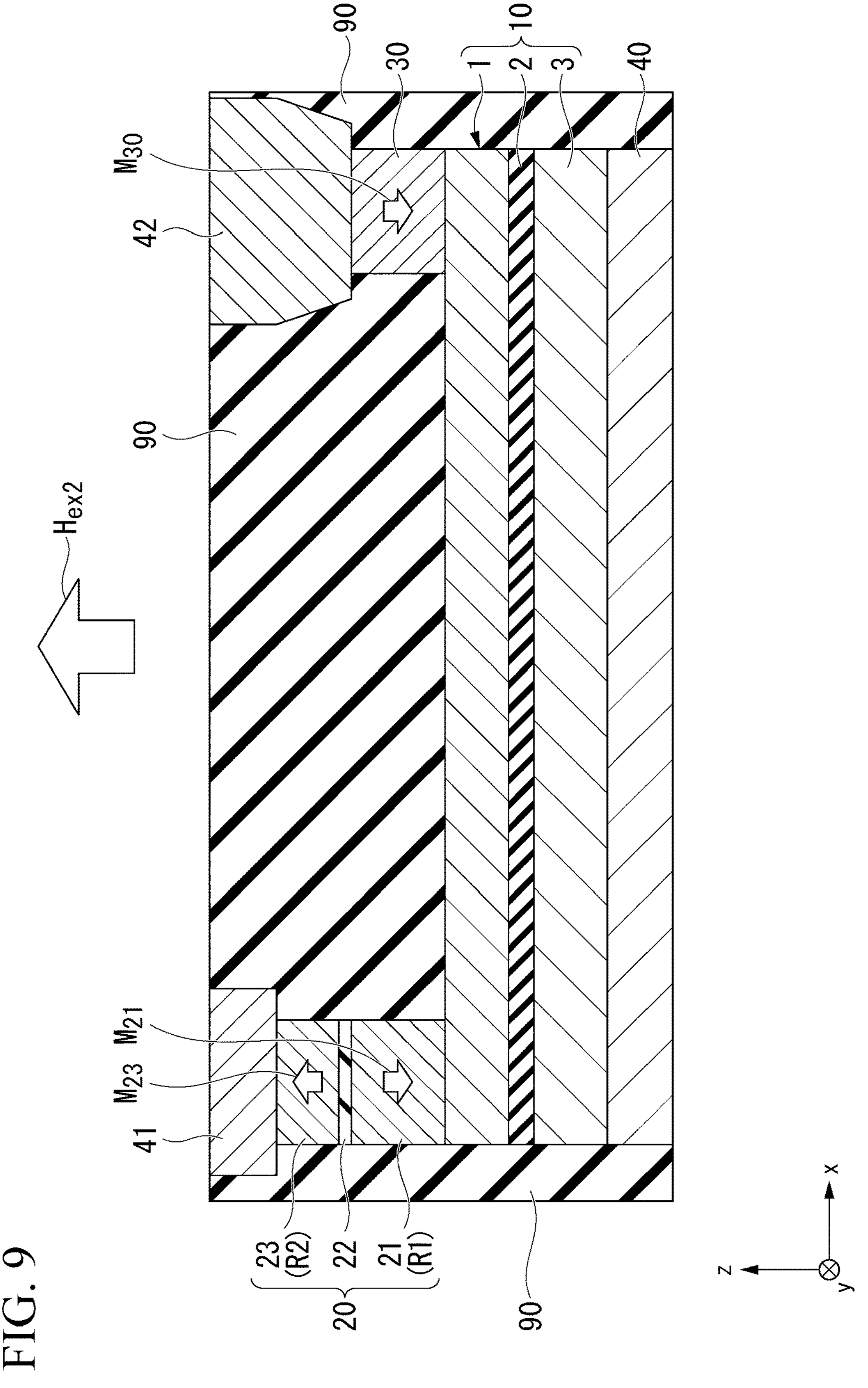
FIG. 9 is a diagram for describing a method of manufacturing the domain wall displacement element according to the first embodiment.

Next, as shown in FIG. 9, an external magnetic field $H_{ex2}$ is applied to the domain wall displacement element 100 in a direction opposite to the direction in which the external magnetic field $H_{ex1}$ is applied earlier. The external magnetic field $H_{ex2}$ is smaller than the external magnetic field $H_{ex1}$. The external magnetic field $H_{ex2}$ is, for example, gradually increased from a sufficiently low intensity. The second region R2 has a smaller coercive force than the first region R1. When the external magnetic field $H_{ex2}$ is applied, the magnetization $M_{23}$ of the ferromagnetic layer 23 having a small coercive force is first reversed. Since the second magnetization fixed layer 30 has a constant volume and a coercive force equal to or greater than a predetermined value, the magnetization $M_{30}$ is not reversed in the external magnetic field $H_{ex2}$.

When the magnetization $M_{23}$ of the ferromagnetic layer 23 is reversed, the magnetization $M_{21}$ of the ferromagnetically coupled ferromagnetic layer 21 is reversed. By reversing the magnetization $M_{21}$, magnetization orientation directions of the two ferromagnetic layers (the ferromagnetic layer 21 and the second magnetization fixed layer 30) in contact with the domain wall displacement layer 1 are opposite to each other.

The domain wall displacement element 100 shown in FIG. 3 is produced according to the procedure described above. Even if the plurality of domain wall displacement elements 100 are produced at the same time, the intermediate layer 84 functions as a stopper of etching so that each of the second magnetization fixed layers 30 is not excessively removed. As a result, each of the second magnetization fixed layers 30 has a constant volume and a coercive force equal to or greater than a predetermined value. Therefore, it is avoided that the magnetization $M_{30}$ of the second magnetization fixed layer 30 of some domain wall displacement elements 100 is reversed unexpectedly due to the external magnetic field $H_{ex2}$. In addition, since the magnetization is reversed using ferromagnetic coupling, a magnetization direction can be defined only by applying small external magnetic fields $H_{ex1}$ and $H_{ex2}$. In addition, by ferromagnetically coupling the ferromagnetic layers 21 and 23, a resistance value between the ferromagnetic layer 21 and the ferromagnetic layer 23 is lower than when they are antiferromagnetically coupled. When the resistance value between the ferromagnetic layer 21 and the ferromagnetic layer 23 is lowered, a voltage required for domain wall displacement is reduced when a write current is applied to the domain wall displacement layer 1 through the first magnetization fixed layer 20.

Moreover, by stabilizing the orientation direction of the magnetization $M_{30}$ of the second magnetization fixed layer 30, it is possible to suppress occurrence of variations in the magnetization direction among the plurality of domain wall displacement elements 100.

Second Embodiment

Figure 10:
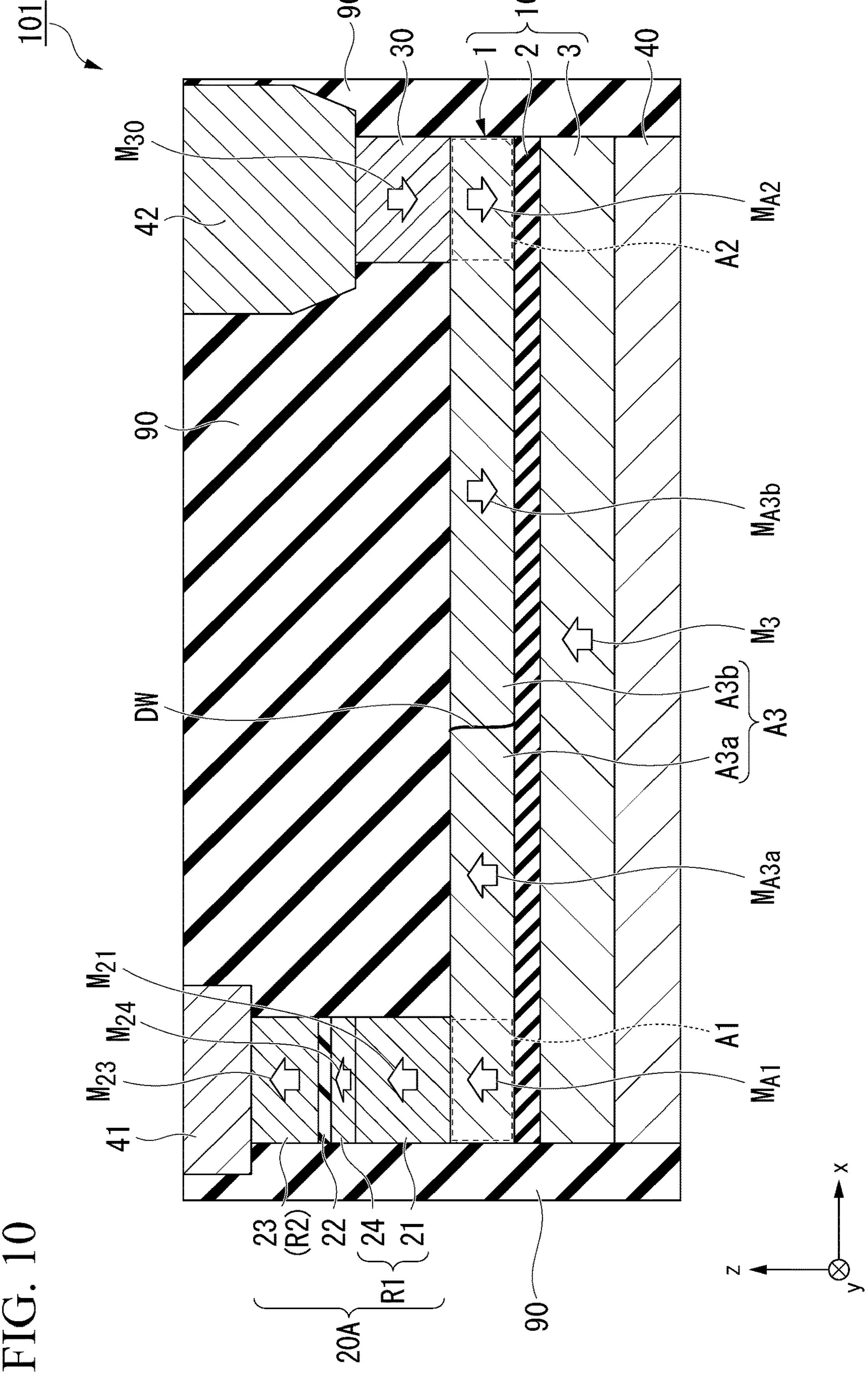
FIG. 10 is a sectional view of a domain wall displacement element according to a second embodiment.

FIG. 10 is a sectional view of a domain wall displacement element 101 according to a second embodiment, taken along the xz plane passing through the center of the domain wall displacement layer 1 in the y direction. The domain wall displacement element 101 according to the second embodiment is different from that of the first embodiment in configuration of a first magnetization fixed layer 20A. In the second embodiment, the same reference numerals are given to the same constituents as in the first embodiment, and description thereof will be omitted.

The first magnetization fixed layer 20A has a first region R1, an intermediate layer 22, and a second region R2. As shown in FIG. 10, the first region R1 is made of the plurality of ferromagnetic layers 21 and 24, and the second region R2 is made of a ferromagnetic layer 23. The ferromagnetic layer 24 and the ferromagnetic layer 23 are in contact with the intermediate layer 22. The ferromagnetic layer 24 is an example of the first ferromagnetic layer. The ferromagnetic layer 23 is an example of the second ferromagnetic layer. The ferromagnetic layer 21 and the second magnetization fixed layer 30 have the same film structure.

The two ferromagnetic layers 24 and 23 that are in contact with the intermediate layer 22 and interpose the intermediate layer 22 therebetween are ferromagnetically coupled. For this reason, an orientation direction of the magnetization $M_{24}$ of the ferromagnetic layer 24 and the orientation direction of the magnetization $M_{23}$ of the ferromagnetic layer 23 match each other. Since the ferromagnetic layer 21 and the ferromagnetic layer 24 are in direct contact, the orientation directions of the magnetizations $M_{21}$ and $M_{24}$ match each other. Materials constituting the ferromagnetic layer 24 are the same as those of the reference layer 3 described above. The ferromagnetic layer 24 is, for example, different from the ferromagnetic layer 21 in material or composition.

The domain wall displacement element 101 according to the second embodiment can be produced by laminating another ferromagnetic layer between the first layer 81 and the intermediate layer 82 when the laminated body 80 is formed.

The domain wall displacement element 101 according to the second embodiment can obtain the same effects as the domain wall displacement element 100 according to the first embodiment. In addition, since the first region R1 is made of the plurality of ferromagnetic layers 21 and 24, it is possible to adjust a strength of ferromagnetic coupling and a strength of a coercive force of the entire first magnetization fixed layer 20A.

Third Embodiment

Figure 11:
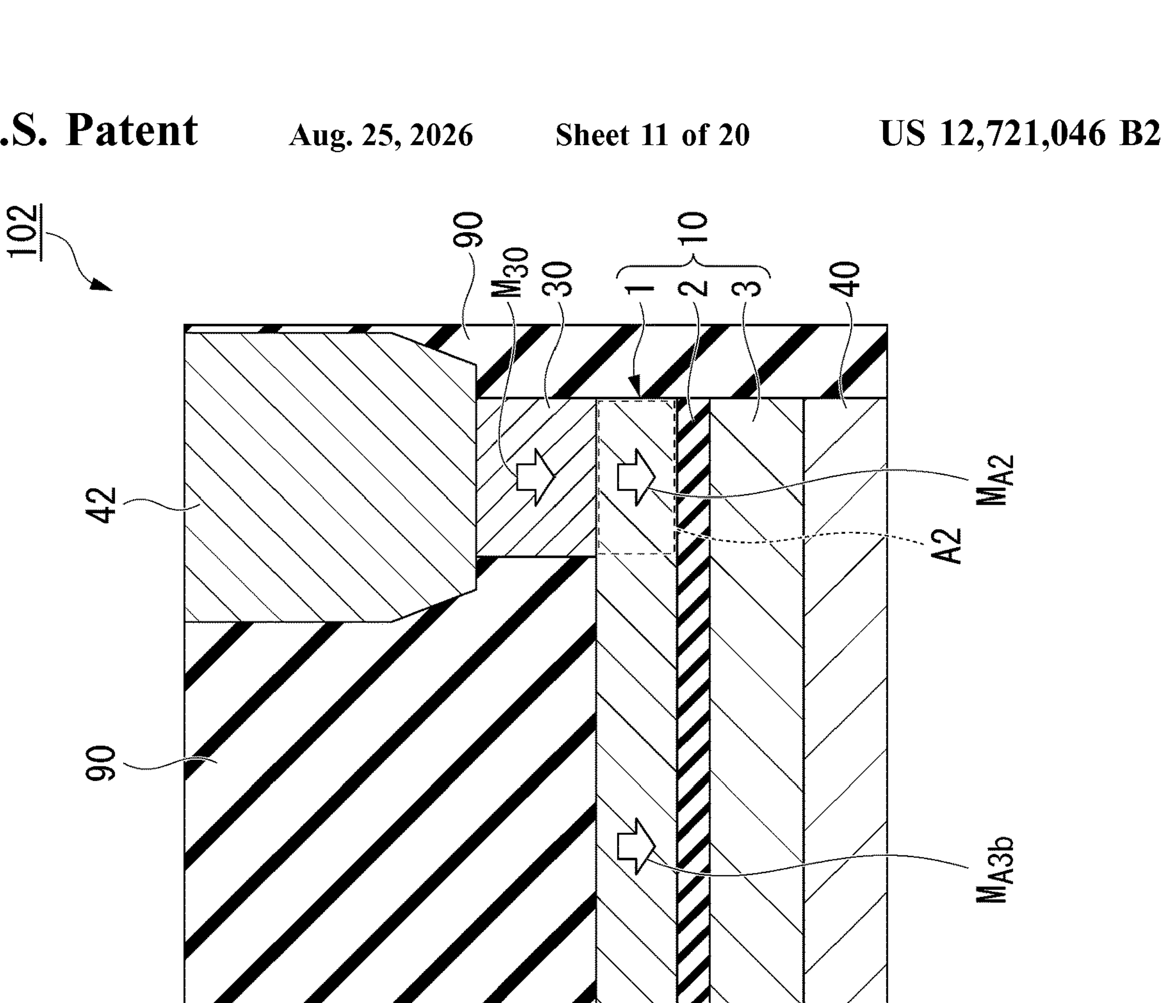
FIG. 11 is a sectional view of a domain wall displacement element according to a third embodiment.

FIG. 11 is a sectional view of a domain wall displacement element 102 according to a third embodiment taken along the xz plane passing through the center of the domain wall displacement layer 1 in the y direction. The domain wall displacement element 102 according to the third embodiment is different from the domain wall displacement element 100 according to the first embodiment in configuration of a first magnetization fixed layer 20B. In the third embodiment, the same reference numerals are given to the same constituents as in the first embodiment, and the description thereof will be omitted.

The first magnetization fixed layer 20B has a first region R1, an intermediate layer 22, and a second region R2. As shown in FIG. 11, the first region R1 is made of a ferromagnetic layer 21, and the second region R2 is made of a laminated body of a ferromagnetic layer 23 and an intermediate layer 25. The ferromagnetic layer 21 is an example of the first ferromagnetic layer, and the ferromagnetic layer 23 in contact with the intermediate layer 22 among a plurality of ferromagnetic layers 23 is an example of the second ferromagnetic layer. The intermediate layer 25 has one or more layers. The intermediate layer 25 is an example of the second intermediate layer. Each intermediate layer 25 may be a single layer or multiple layers. Each intermediate layer 25 may be made of, for example, a plurality of non-magnetic layers.

The two ferromagnetic layers 21 and 23 that are in contact with the intermediate layer 22 and interpose the intermediate layer 22 therebetween are ferromagnetically coupled. Two ferromagnetic layers 23 that are in contact with the intermediate layer 25 and interpose the intermediate layer 25 therebetween are ferromagnetically coupled. As a result, the orientation direction of the magnetization $M_{21}$ of the ferromagnetic layer 21 and the orientation direction of the magnetization $M_{23}$ of each ferromagnetic layer 23 match each other.

The intermediate layer 25 is made of the same materials as those of the intermediate layer 22. Each of the intermediate layer 22 and the plurality of intermediate layers 25 may be made of the same material, or any one may be different from the other layers in material or thickness. The intermediate layer 25 is, for example, an oxide. The intermediate layer 25 is, for example, amorphous. A strength of ferromagnetic coupling between the adjacent ferromagnetic layers 21 and 23 can be adjusted by a thickness, a material, and the like of the intermediate layers 22 and 25. The thickness of the intermediate layer 25 is, for example, 1 nm or more.

The domain wall displacement element 102 according to the third embodiment has the same effects as the domain wall displacement element 100 according to the first embodiment. In addition, since a height of the first magnetization fixed layer 20B is increased by inserting the intermediate layer 25, an effect of a leakage magnetic field generated from an upper surface of the first magnetization fixed layer 20B on the domain wall displacement layer 1 can be reduced.

Fourth Embodiment

Figure 12:
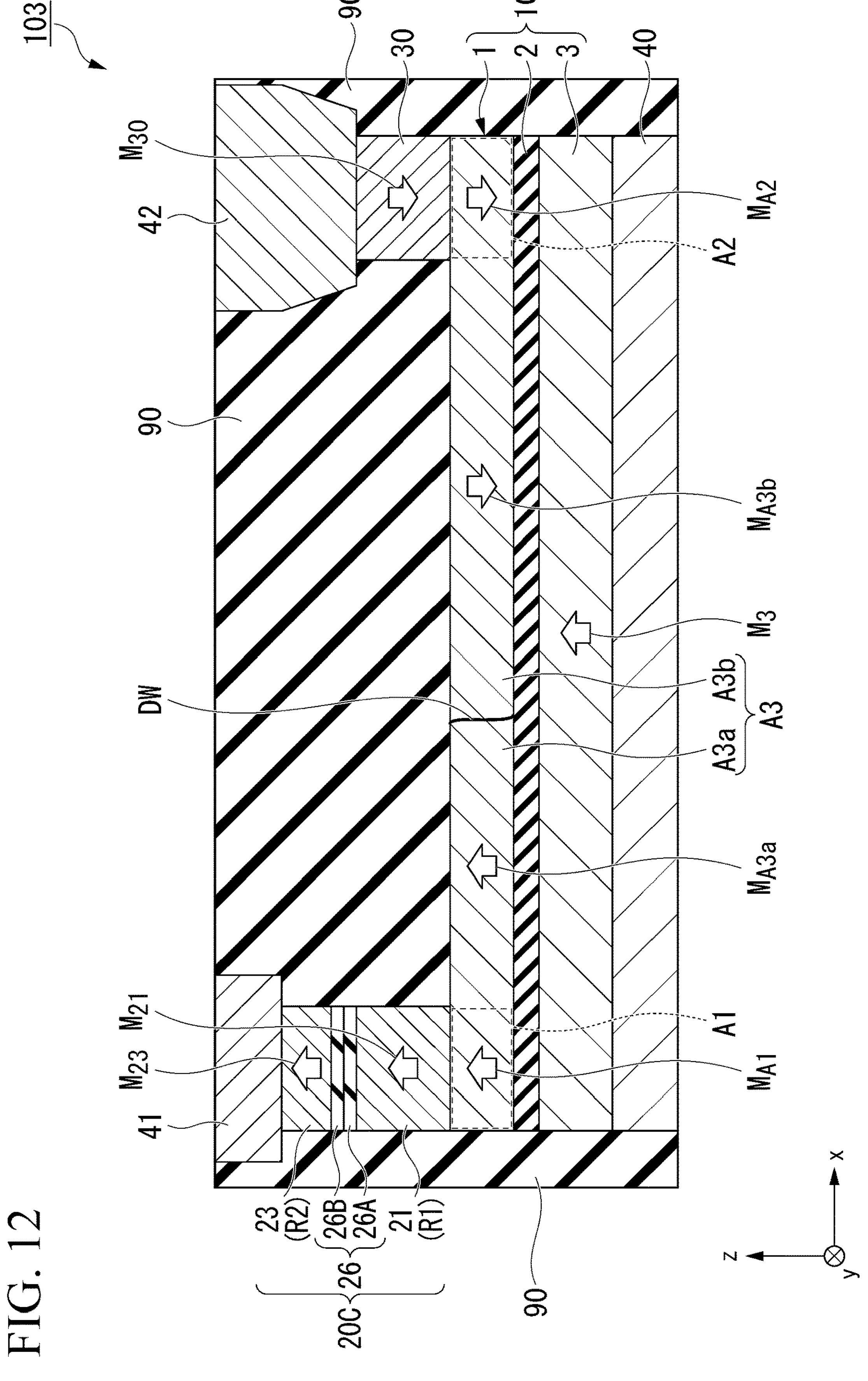
FIG. 12 is a sectional view of a domain wall displacement element according to a fourth embodiment.

FIG. 12 is a sectional view of a domain wall displacement element 103 according to a fourth embodiment taken along the xz plane passing through the center of the domain wall displacement layer 1 in the y direction. The domain wall displacement element 103 according to the fourth embodiment is different from the domain wall displacement element 100 according to the first embodiment in configuration of a first magnetization fixed layer 20C. In the fourth embodiment, the same reference numerals are given to the same constituents as in the first embodiment, and the description thereof will be omitted.

The first magnetization fixed layer 20C has a first region R1, an intermediate layer 26, and a second region R2. As shown in FIG. 12, the first region R1 is made of a ferromagnetic layer 21 and the second region R2 is made of a ferromagnetic layer 23. The intermediate layer 26 is made of a plurality of non-magnetic layers 26A and 26B.

Each of the plurality of non-magnetic layers 26A and 26B can be made by using the same materials as those of the intermediate layer 22.

The domain wall displacement element 103 according to the fourth embodiment has the same effects as the domain wall displacement element 100 according to the first embodiment. In addition, since the intermediate layer 26 is made of a plurality of non-magnetic layers 26A and 26B, roles played by the intermediate layer 22 as a single layer can be divided into each of the non-magnetic layers 26A and 26B. For example, an appropriate material can be selected as a stopper during milling for the non-magnetic layer 26A, and a material that enhances magnetic properties of the ferromagnetic layer 23 can be selected for the non-magnetic layer 26B.

Fifth Embodiment

Figure 13:
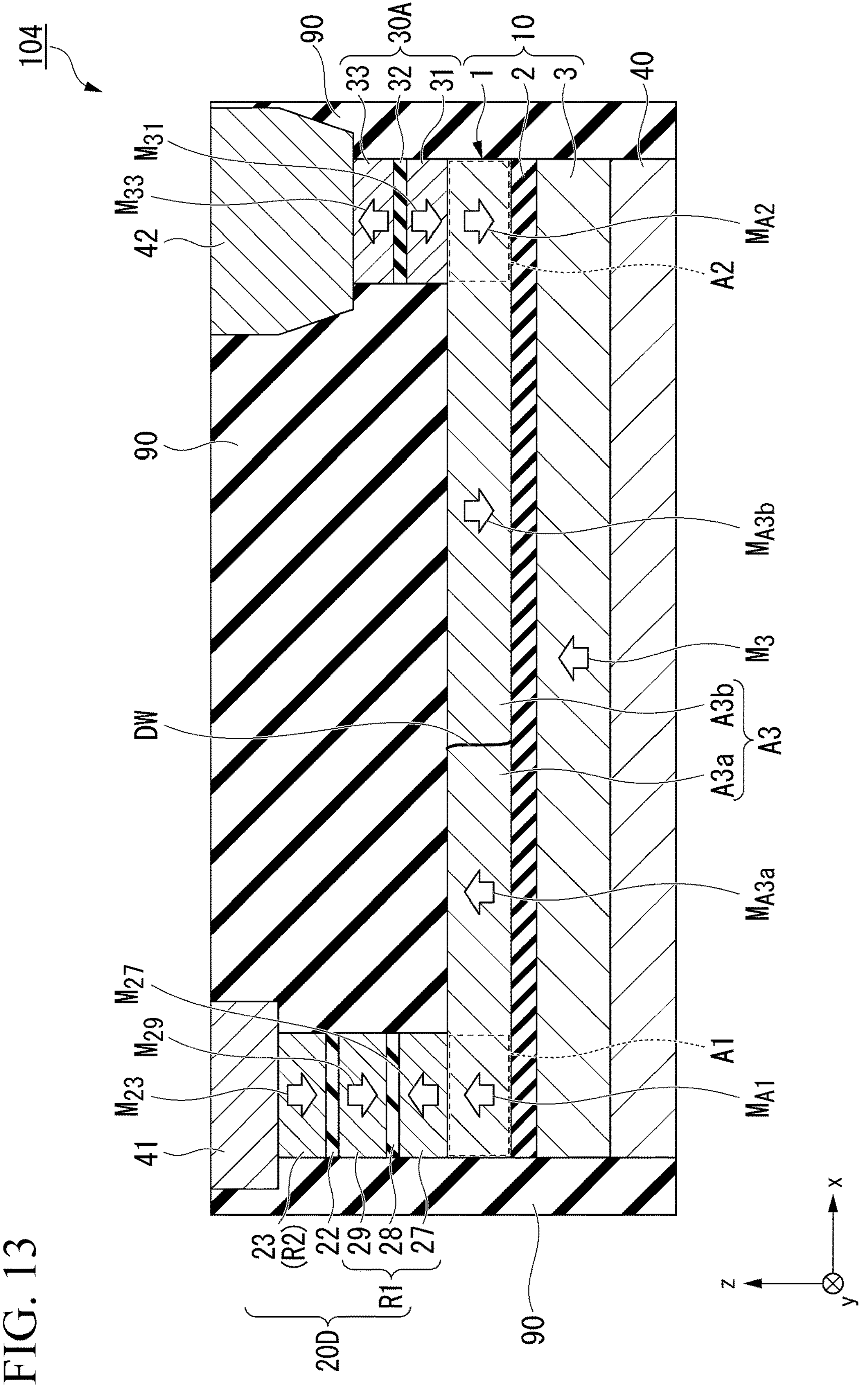
FIG. 13 is a sectional view of a domain wall displacement element according to a fifth embodiment.

FIG. 13 is a sectional view of a domain wall displacement element 104 according to a fifth embodiment taken along the xz plane passing through the center of the domain wall displacement layer 1 in the y direction. The domain wall displacement element 104 according to the fifth embodiment is different from the domain wall displacement element 100 according to the first embodiment in configurations of a first magnetization fixed layer 20D and a second magnetization fixed layer 30A. In the fourth embodiment, the same reference numerals are given to the same constituents as in the first embodiment, and the description thereof will be omitted.

The first magnetization fixed layer 20D has a first region R1, an intermediate layer 22, and a second region R2. A ferromagnetic layer 29 in contact with the intermediate layer 22 in the first region R1 and the ferromagnetic layer 23 in contact with the intermediate layer 22 in the second region R2 are ferromagnetically coupled. The ferromagnetic layer 29 is an example of the first ferromagnetic layer, and the ferromagnetic layer 23 is an example of the second ferromagnetic layer.

As shown in FIG. 13, the first region R1 is made of a ferromagnetic layer 27, an intermediate layer 28, and the ferromagnetic layer 29, and the second region R2 is made of the ferromagnetic layer 23. The ferromagnetic layer 27 and the ferromagnetic layer 29 are antiferromagnetically coupled with the intermediate layer 28 interposed therebetween. An orientation direction of the magnetization $M_{27}$ of the ferromagnetic layer 27 and an orientation direction of the magnetization $M_{29}$ of the ferromagnetic layer 29 are opposite to each other. The intermediate layer 28 is an example of a third intermediate layer. The intermediate layer 28 is, for example, Ru, Ir, Rh, or the like.

In addition, the orientation direction of the magnetization $M_{23}$ of the ferromagnetic layer 23 that constitutes the second region R2 and an orientation direction of the magnetization $M_3$ of the reference layer 3 are different from each other. When the magnetization $M_{23}$ of the ferromagnetic layer 23 positioned on a top layer of the domain wall displacement element 104 and the magnetization $M_3$ of the reference layer 3 positioned on a bottom layer are in an antiparallel relationship, a leakage magnetic field of the entire domain wall displacement element 104 can be reduced, and the influence thereof on surrounding elements can be reduced.

In addition, the second magnetization fixed layer 30A has a ferromagnetic layer 31, an intermediate layer 32, and a ferromagnetic layer 33. The ferromagnetic layer 31 and the ferromagnetic layer 33 are antiferromagnetically coupled with the intermediate layer 32 interposed therebetween. An orientation direction of the magnetization $M_{31}$ of the ferromagnetic layer 31 and an orientation direction of the magnetization $M_{33}$ of the ferromagnetic layer 33 are opposite to each other. The ferromagnetic layer 27 in contact with the domain wall displacement layer 1 in the first region R1 and the ferromagnetic layer 31 in contact with the domain wall displacement layer 1 in the second magnetization fixed layer 30A have the same film structure. The intermediate layer 32 has the same configuration as the intermediate layer 28 and the ferromagnetic layer 33 has the same configuration as the ferromagnetic layer 29. The intermediate layer 32 is, for example, Ru, Ir, Rh, or the like.

The domain wall displacement element 104 according to the fifth embodiment has the same effects as the domain wall displacement element 100 according to the first embodiment. Moreover, the first region R1 and the second magnetization fixed layer 30A have a synthetic antiferromagnetic structure (SAF), so that leakage magnetic fields from the first region R1 and the second magnetization fixed layer 30A can be reduced.

Sixth Embodiment

Figure 14:
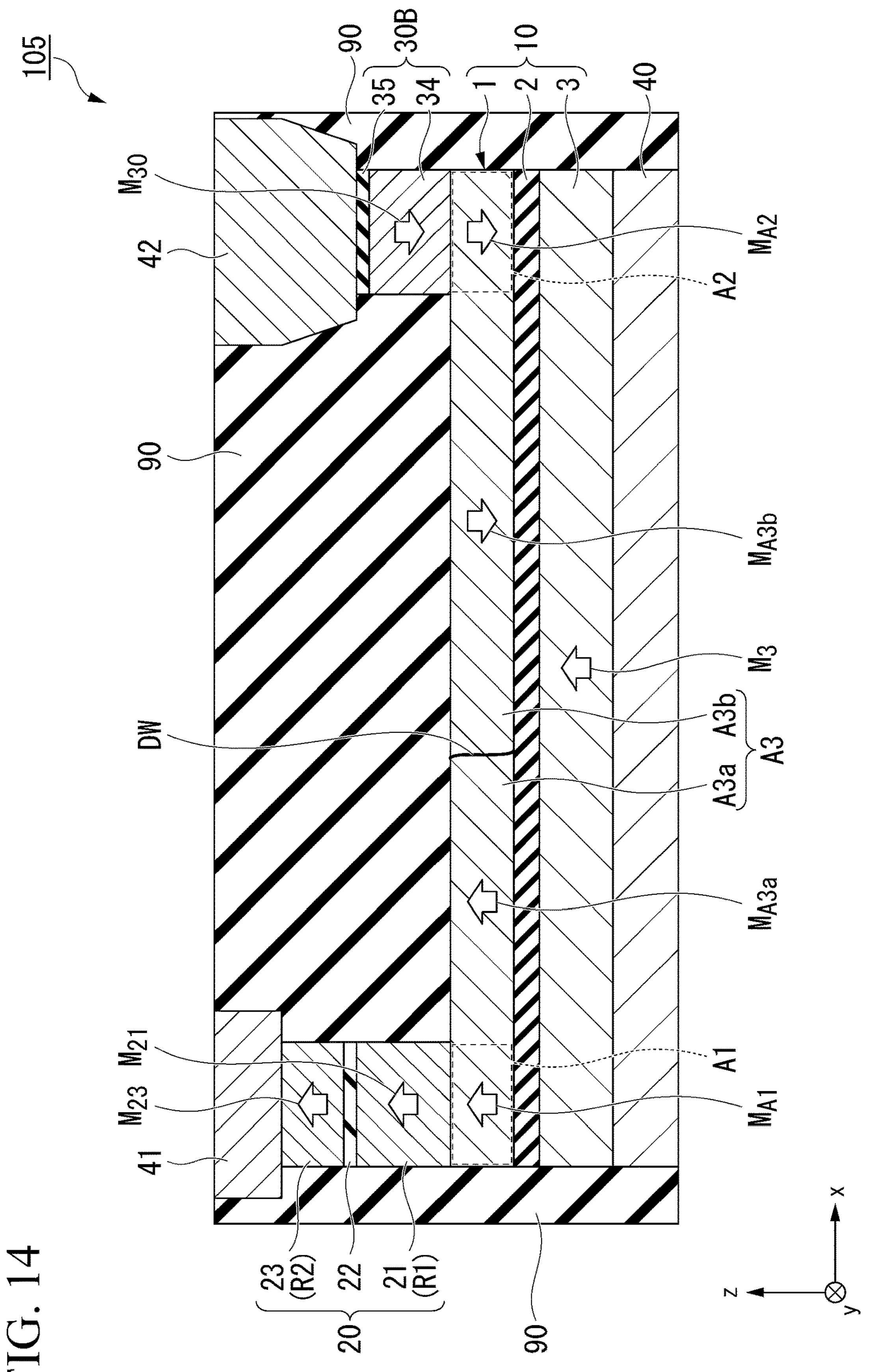
FIG. 14 is a sectional view of a domain wall displacement element according to a sixth embodiment.

FIG. 14 is a sectional view of a domain wall displacement element 105 according to a sixth embodiment taken along the xz plane passing through the center of the domain wall displacement layer 1 in the y direction. The domain wall displacement element 105 according to the sixth embodiment is different from the domain wall displacement element 100 according to the first embodiment in configuration of a second magnetization fixed layer 30B. In the sixth embodiment, the same reference numerals are given to the same constituents as in the first embodiment, and the description thereof will be omitted.

The second magnetization fixed layer 30B has a ferromagnetic layer 34 and an intermediate layer 35. The intermediate layer 35 is an example of a fourth intermediate layer. The intermediate layer 35 is a residual of the intermediate layer 84 after milling the laminated body 86. A ferromagnetic layer may be further provided between the intermediate layer 35 and the electrode 42. The intermediate layer 35 contains the same materials as the intermediate layer 22. The intermediate layer 35 is formed at the same time as the intermediate layer 22.

The domain wall displacement element 105 according to the sixth embodiment has the same effects as the domain wall displacement element 100 according to the first embodiment.

Seventh Embodiment

Figure 15:
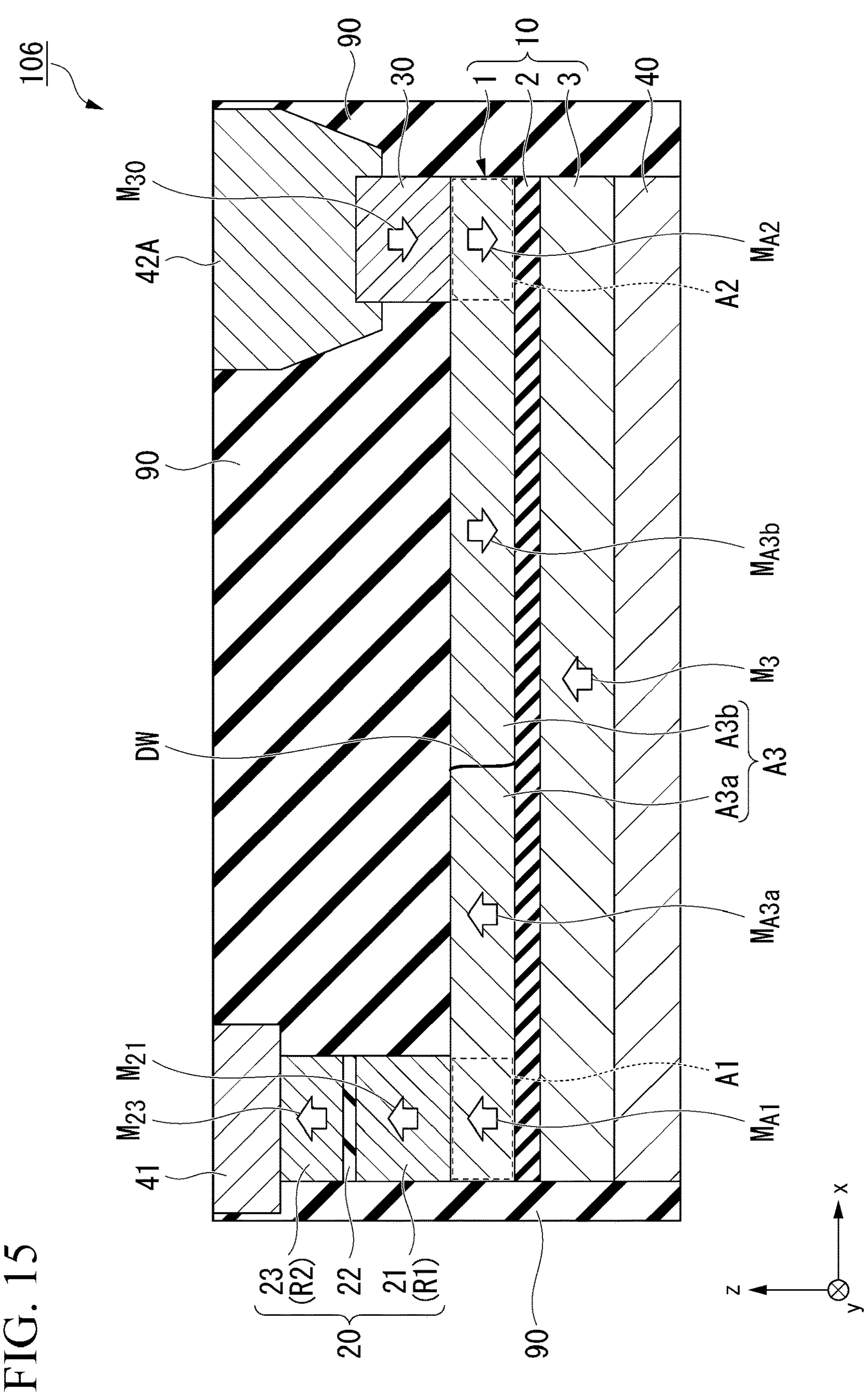
FIG. 15 is a sectional view of a domain wall displacement element according to a seventh embodiment.

FIG. 15 is a sectional view of a domain wall displacement element 106 according to a seventh embodiment taken along the xz plane passing through the center of the domain wall displacement layer 1 in the y direction. The domain wall displacement element 106 according to the seventh embodiment is different from the domain wall displacement element 100 according to the first embodiment in a shape of an electrode 42A. In the seventh embodiment, the same reference numerals are given to the same constituents as in the first embodiment, and the description thereof will be omitted.

The electrode 42A covers a part of side surfaces of the second magnetization fixed layer 30. The electrode 42A covers the side surfaces of the second magnetization fixed layer 30, and thereby heat dissipation of the second magnetization fixed layer 30 is improved. As a result, stability of the magnetization $M_{30}$ of the second magnetization fixed layer 30 is improved.

The domain wall displacement element 106 according to the seventh embodiment has the same effects as the domain wall displacement element 100 according to the first embodiment.

Eighth Embodiment

Figure 16:
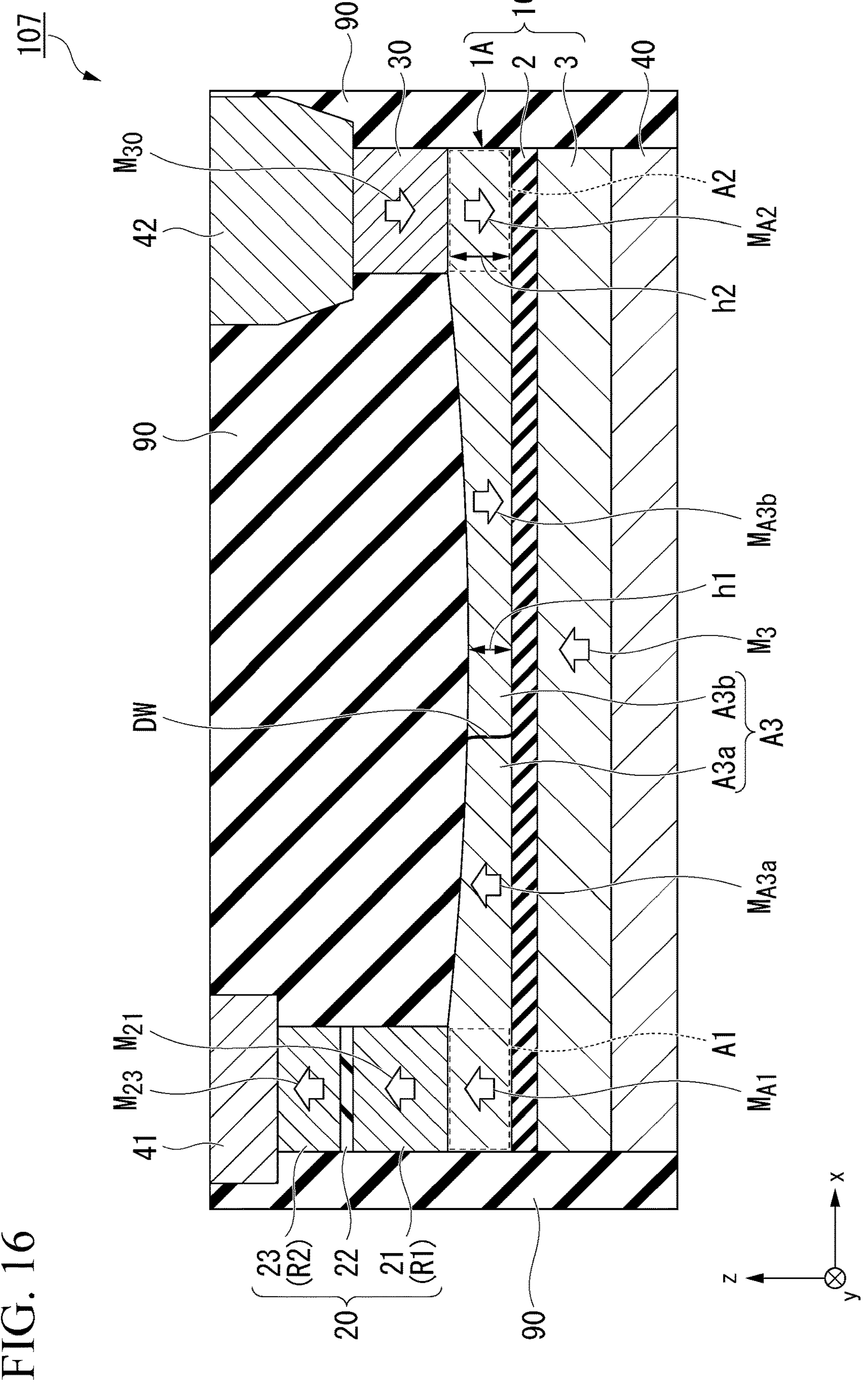
FIG. 16 is a sectional view of a domain wall displacement element according to an eighth embodiment.

FIG. 16 is a sectional view of a domain wall displacement element 107 according to an eighth embodiment taken along the xz plane passing through the center of a domain wall displacement layer 1A in the y direction. The domain wall displacement element 107 according to the eighth embodiment is different from the domain wall displacement element 100 according to the first embodiment in a shape of the domain wall displacement layer 1A. In the eighth embodiment, the same reference numerals are given to the same constituents as in the first embodiment, and the description thereof will be omitted.

A thickness of the domain wall displacement layer 1A is not constant. A thickness h2 of the domain wall displacement layer 1A at a contact portion in contact with the first magnetization fixed layer 20 or the second magnetization fixed layer 30 is thicker than a thickness h1 at an intermediary point between two contact portions in the x-direction. An upper surface of the domain wall displacement layer 1A is curved to be concave toward the reference layer 3. The upper surface of the domain wall displacement layer 1A is, for example, a smoothly curved surface that is concave toward the reference layer 3.

The domain wall displacement element 107 according to the eighth embodiment can obtain the same effect as the domain wall displacement element 100 according to the first embodiment. In addition, when the thickness of the contact portion in contact with the first magnetization fixed layer 20 or the second magnetization fixed layer 30 is thicker, a current density at that portion is reduced, and penetration of the domain wall DW into the magnetization fixed regions A1 and A2 can be further prevented. Moreover, the upper surface of the domain wall displacement layer 1A is curved, and thereby stress concentration can be prevented from occurring at an interface between the insulating layer 90 and the domain wall displacement layer 1A.

Ninth Embodiment

Figure 17:
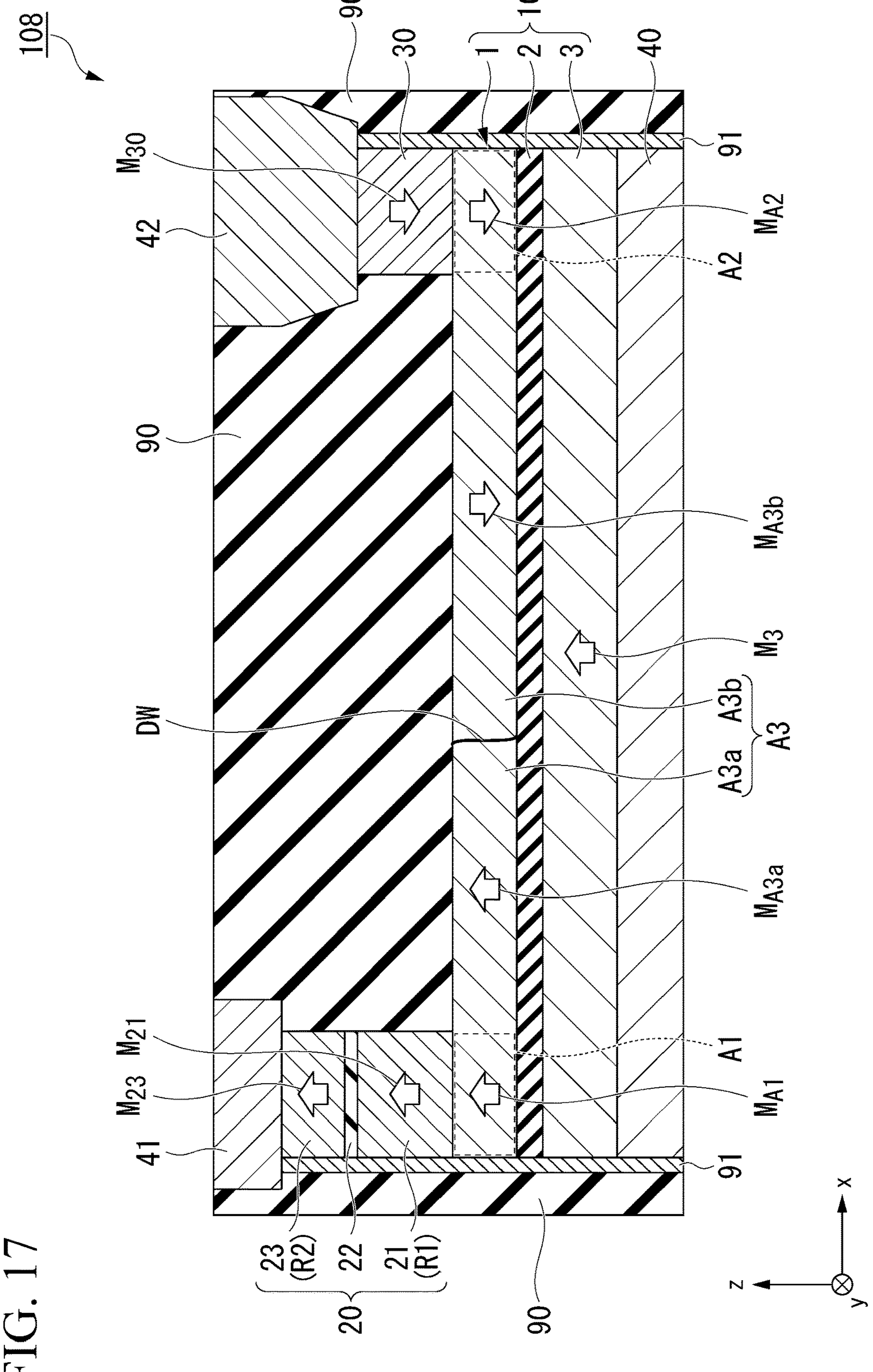
FIG. 17 is a sectional view of a domain wall displacement element according to a ninth embodiment.

FIG. 17 is a sectional view of a domain wall displacement element 108 according to a ninth embodiment taken along the xz plane passing through the center of the domain wall displacement layer 1 in the y direction. The domain wall displacement element 108 according to the ninth embodiment is different from the domain wall displacement element 100 according to the first embodiment in that it further includes an insulating layer 91. In the ninth embodiment, the same reference numerals are given to the same constituents as in the first embodiment, and the description thereof will be omitted.

The insulating layer 91 covers outer side surfaces of the first magnetization fixed layer 20 and the second magnetization fixed layer 30. The outer side surfaces are side surfaces positioned on an outer side in the x direction. The outer side surface is an example of a second side surface. Inner side surfaces of the first magnetization fixed layer 20 and the second magnetization fixed layer 30 are covered with the insulating layer 90. The inner side surface is an example of a first side surface. FIG. 17 shows an example in which the side surfaces of the first magnetization fixed layer 20 and the second magnetization fixed layer 30 in the x direction are covered with the insulating layer 91, but the side surfaces in the y direction may be covered with the insulating layer 91.

The insulating layer 91 can be made by using the same material as the insulating layer 90. The insulating layer 91 is different from the insulating layer 90. Thermal conductivity of the insulating layer 91 is, for example, higher than that of the insulating layer 90. For example, the insulating layer 91 is MgO and the insulating layer 90 is $SiO_2$.

The domain wall displacement element 108 according to the ninth embodiment has the same effects as the domain wall displacement element 100 according to the first embodiment. In addition, since the insulating layer 91 having excellent thermal conductivity is provided on the outer side surface, it is possible to prevent deterioration of the magnetization stability of the first magnetization fixed layer 20 and the second magnetization fixed layer 30. In addition, by covering the inner side surface with the insulating layer 90, heat can be stored between the first magnetization fixed layer 20 and the second magnetization fixed layer 30, and a movement of the domain wall DW of the domain wall displacement layer 1 can be promoted.

Tenth Embodiment

Figure 18:
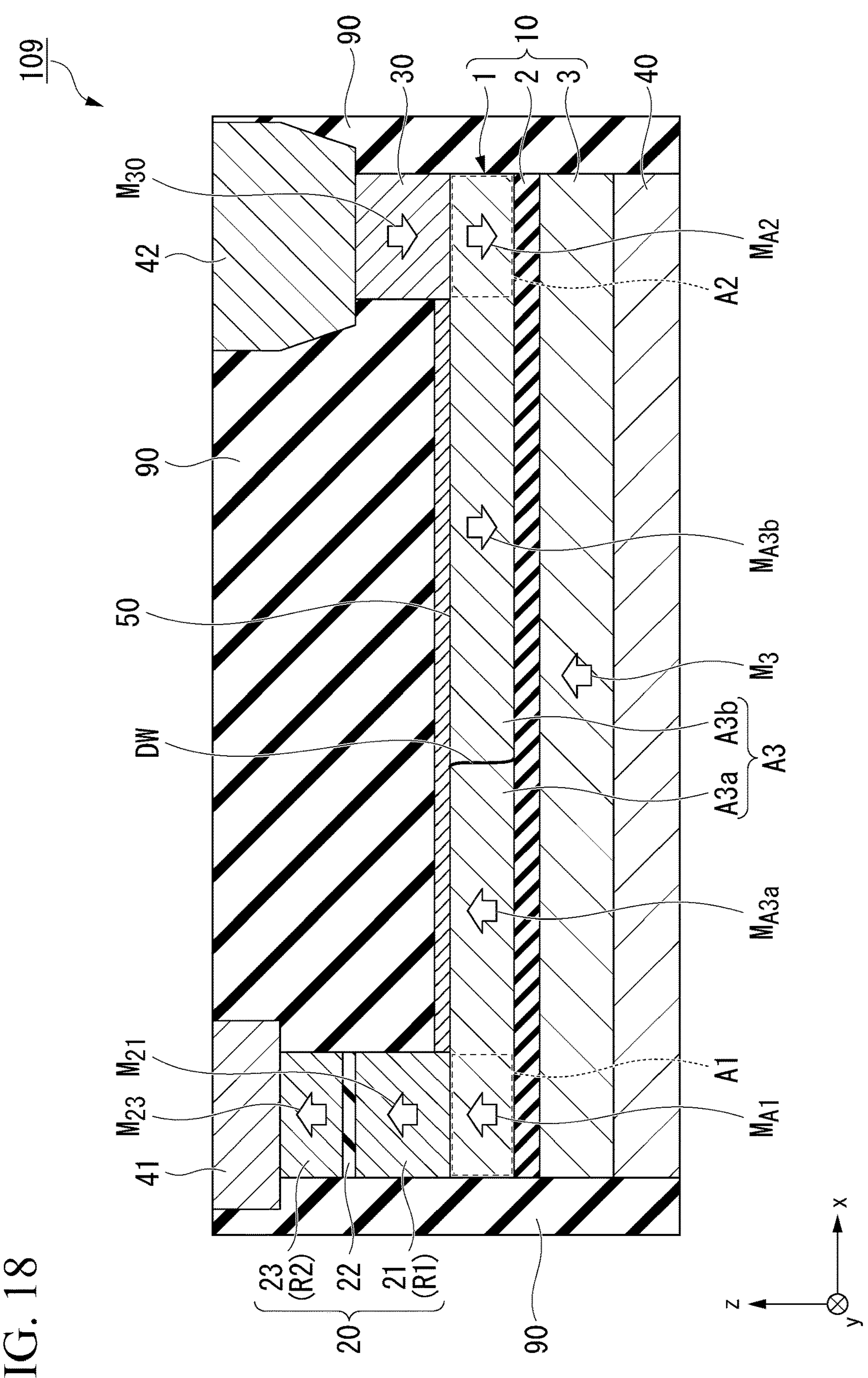
FIG. 18 is a sectional view of a domain wall displacement element according to a tenth embodiment.

FIG. 18 is a sectional view of a domain wall displacement element 109 according to a tenth embodiment taken along the xz plane passing through the center of the domain wall displacement layer 1 in the y direction. The domain wall displacement element 109 according to the tenth embodiment is different from the domain wall displacement element 100 according to the first embodiment in that it further includes a conductive layer 50. In the tenth embodiment, the same reference numerals are given to the same constituents as in the first embodiment, and the description thereof will be omitted.

The conductive layer 50 is in contact with the domain wall displacement layer 1. The conductive layer 50 interposes the domain wall displacement layer 1 together with the nonmagnetic layer 2.

The conductive layer 50 contains any one of metals, alloys, intermetallic compounds, metal borides, metal carbides, metal silicides, and metal phosphides that have a function of generating a spin current by a spin Hall effect when a current flows.

The conductive layer 50 contains, for example, a nonmagnetic heavy metal as a main element. The main element is an element with the highest ratio among elements constituting the conductive layer 50. The conductive layer 50 includes, for example, a heavy metal having a specific gravity equal to or greater than yttrium (Y). The nonmagnetic heavy metal has a large atomic number of 39 or more and has d electrons or f electrons in the outermost shell, so that a strong spin-orbit interaction occurs. The spin Hall effect is caused by the spin-orbit interaction, and spins are likely to be unevenly distributed in the conductive layer 50, which makes it easier to generate a spin current. The conductive layer 50 includes, for example, any one selected from a group consisting of Au, Hf, Mo, Pt, W and Ta.

The conductive layer 50 generates a spin current by the spin Hall effect when a current flows, and injects spins into the domain wall displacement layer 1. The conductive layer 50 provides, for example, spin orbit torque (SOT) to the magnetization of the domain wall displacement layer 1. The spin-orbit torque (SOT) caused by spins injected from the conductive layer 50 assists the movement of the domain wall DW. The domain wall DW of the domain wall displacement layer 1 receives the spin-orbit torque (SOT) and becomes easy to move.

The domain wall displacement element 109 according to the tenth embodiment has the same effects as the domain wall displacement element 100 according to the first embodiment. In addition, in the domain wall displacement element 109, since the spins injected from the conductive layer 50 into the domain wall displacement layer 1 assist the movement of the domain wall DW, the domain wall DW can be efficiently moved and power consumption is low.

Eleventh Embodiment

Figure 19:
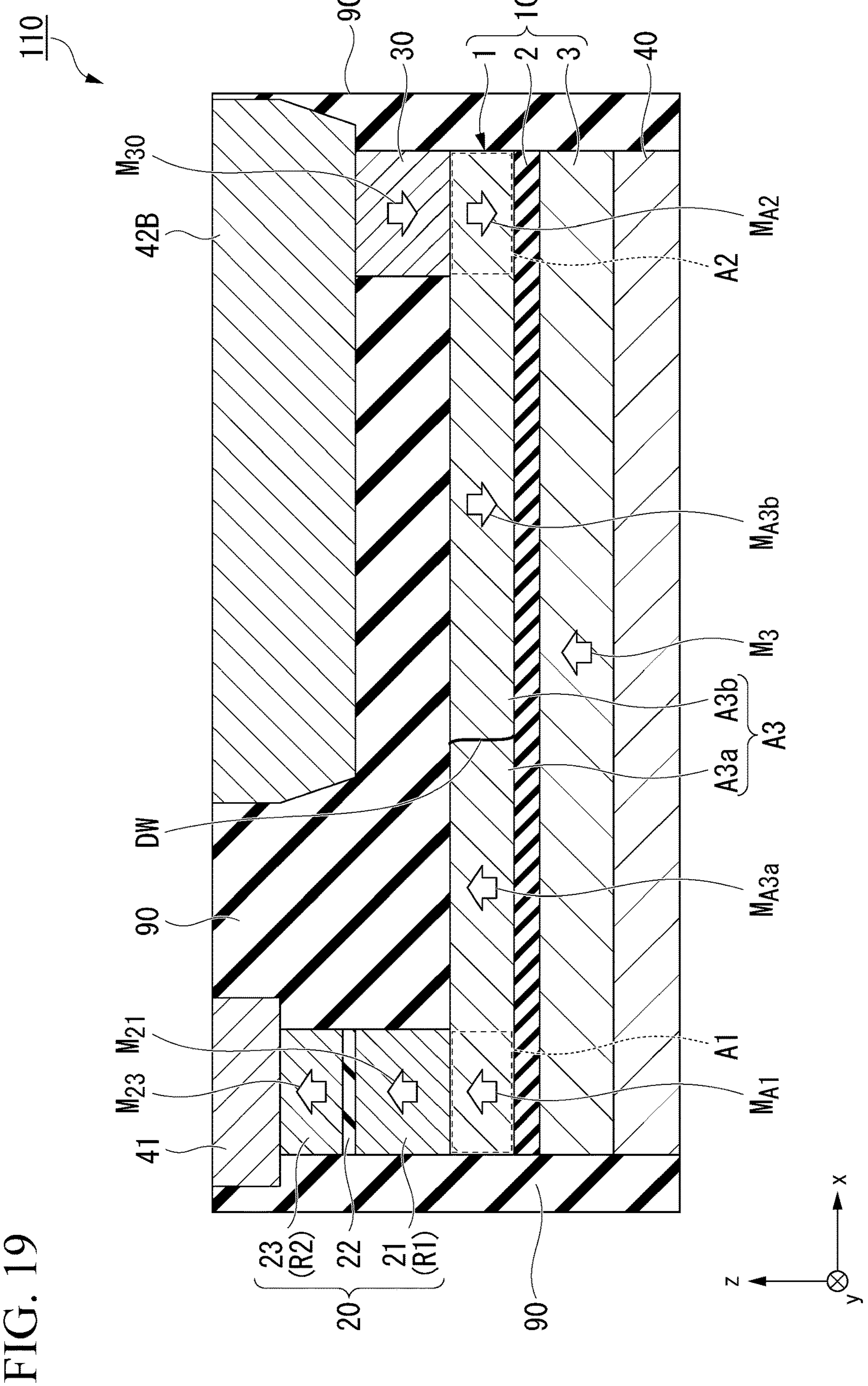
FIG. 19 is a sectional view of a domain wall displacement element according to an eleventh embodiment.

FIG. 19 is a sectional view of a domain wall displacement element 110 according to an eleventh embodiment taken along the xz plane passing through the center of the domain wall displacement layer 1 in the y direction. The domain wall displacement element 110 according to the eleventh embodiment is different from the domain wall displacement element 100 according to the first embodiment in shape of a electrode 42B. In the eleventh embodiment, the same reference numerals are given to the same constituents as in the first embodiment, and the description thereof will be omitted.

The electrode 42B overlaps a middle point of the domain wall displacement layer 1 in the x direction when viewed in the z direction. That is, the electrode 42 faces most of the domain wall displacement layer 1 and covers the most of the domain wall displacement layer 1. A width of a first surface on the second magnetization fixed layer 30 of the electrode 42B in the x direction is longer than, for example, a width of the second magnetization fixed layer 30 in the x direction and a width of the electrode 41 in the x direction. In addition, for example, the width of the first surface on the second magnetization fixed layer 30 of the electrode 42B in the x direction is longer than half a width of the domain wall displacement layer 1 in the x direction.

The domain wall displacement element 110 according to the eleventh embodiment has the same effects as the domain wall displacement element 100 according to the first embodiment. In addition, the domain wall displacement element 110 is excellent in heat dissipation since heat escapes from the domain wall displacement layer 1 to the opposing electrode 42B.

Although preferred embodiments of the present disclosure have been described above, the present disclosure is not limited to these embodiments. For example, characteristic configurations of the respective embodiments may be combined, or part of them may be changed in a range not changing the gist of the disclosure.

Figure 20:
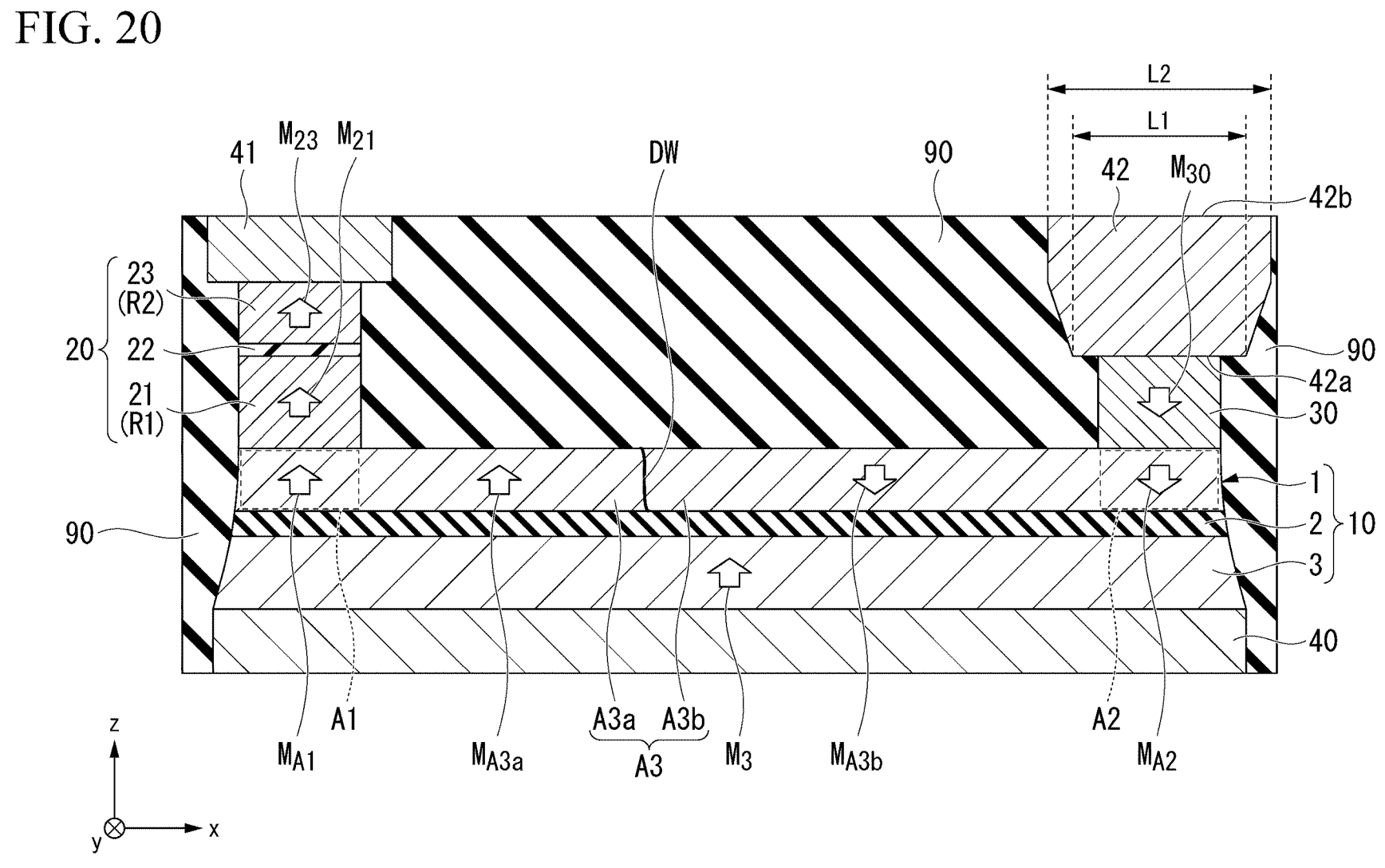

For example, an example in which the side surfaces of each layer are parallel to the z-direction has been shown so far, but, for example, they may be inclined with respect to the z-direction as shown in FIG. 20. In the domain wall displacement element shown in FIG. 20, side surfaces of the magnetoresistance element 10 in the x direction are inclined with respect to the z-direction. The surfaces inclined with respect to the z-direction are not limited to side surfaces in the x-direction, and side surfaces in the y-direction may also be inclined.

REFERENCE SIGNS LIST

1, 1A Domain wall displacement layer
2 Non-magnetic layer
3 Reference layer
10 Magnetoresistance element
20, 20A, 20B, 20C, 20D First magnetization fixed layer
21, 23, 24, 27, 29, 31, 33, 34, 85 Ferromagnetic layer
22, 25, 26, 28, 32, 35, 82, 84 Intermediate layer
26A, 26B Non-magnetic layer
30, 30A, 30B Second magnetization fixed layer
40, 41, 42, 42A, 42B Electrode
42*a* First surface
42*b* Second surface
50 Conductive layer
80, 86 Laminated body
81 First layer
83 Second layer
90, 91 Insulating layer
100, 101, 102, 103, 104, 105, 106, 107, 108, 109, 110 Domain wall displacement element
R1 First region
R2 Second region

The invention claimed is:

1. A domain wall displacement element comprising:

a magnetoresistance element which has a reference layer and a domain wall displacement layer each containing a ferromagnetic body, and a non-magnetic layer between the reference layer and the domain wall displacement layer, and a first magnetization fixed layer and a second magnetization fixed layer which are each in direct or indirect contact with the domain wall displacement layer and are spaced apart from each other, wherein the first magnetization fixed layer has a first region closest to the domain wall displacement layer, a non-magnetic first intermediate layer in contact with the first region, and a second region in contact with the first intermediate layer, the first region has a first ferromagnetic layer in contact with the first intermediate layer, the second region has a second ferromagnetic layer in contact with the first intermediate layer, the first ferromagnetic layer and the second ferromagnetic layer are ferromagnetically coupled, a magnetization direction of the first ferromagnetic layer and a magnetization direction of the second ferromagnetic layer are parallel to each other, a ferromagnetic layer closest to the domain wall displacement layer in the first region and a ferromagnetic layer closest to the domain wall displacement layer in the second magnetization fixed layer have the same film configuration, and the first region and the second region are different in film configuration.

2. The domain wall displacement element according to claim 1, wherein the first region includes a plurality of ferromagnetic layers.

3. The domain wall displacement element according to claim 1, wherein the second region has a non-magnetic second intermediate layer and a plurality of ferromagnetic layers ferromagnetically coupled to each other with the second intermediate layer interposed therebetween.

4. The domain wall displacement element according to claim 3, wherein the first intermediate layer and the second intermediate layer are different in material or thickness.

5. The domain wall displacement element according to claim 3, further comprising:

a plurality of second intermediate layers, wherein any one of the first intermediate layer and the plurality of second intermediate layers is different from the other layers in material or thickness.

6. The domain wall displacement element according to claim 3, wherein the second intermediate layer is made of a plurality of non-magnetic layers.

7. The domain wall displacement element according to claim 3, wherein a thickness of the second intermediate layer is 1 nm or more.

8. The domain wall displacement element according to claim 3, wherein the second intermediate layer is a discontinuous film interspersed with non-magnetic bodies, or has openings.

9. The domain wall displacement element according to claim 3, wherein the second intermediate layer is an oxide or amorphous.

10. The domain wall displacement element according to claim 1, wherein the first intermediate layer is made of a plurality of non-magnetic layers.

11. The domain wall displacement element according to claim 1, wherein a thickness of the first intermediate layer is 1 nm or more.

12. The domain wall displacement element according to claim 1, wherein the first intermediate layer is a discontinuous film interspersed with non-magnetic bodies, or has openings.

13. The domain wall displacement element according to claim 1, wherein the first intermediate layer is an oxide or amorphous.

14. The domain wall displacement element according to claim 1, wherein the first region has a non-magnetic third intermediate layer, and a plurality of ferromagnetic layers antiferromagnetically coupled to each other with the third intermediate layer interposed therebetween.

15. The domain wall displacement element according to claim 1, wherein a coercive magnetic force of the first region is greater than a coercive force of the second region.

16. The domain wall displacement element according to claim 1, wherein the first ferromagnetic layer and the second ferromagnetic layer are coupled in a magnetostatic manner.

17. The domain wall displacement element according to claim 1, wherein a magnetization orientation direction of a ferromagnetic layer constituting the second region is different from a magnetization orientation direction of the reference layer.

18. The domain wall displacement element according to claim 1, further comprising:

a first electrode in contact with the first magnetization fixed layer and a second electrode in contact with the second magnetization fixed layer, wherein the first electrode and the second electrode are different in shape.

19. The domain wall displacement element according to claim 18, wherein the second electrode covers a portion of a side surface of the second magnetization fixed layer.

20. The domain wall displacement element according to claim 18, wherein the second electrode has a peripheral length of a first surface in contact with the second magnetization fixed layer, which is shorter than a peripheral length of a second surface opposite to the first surface.

21. The domain wall displacement element according to claim 18, wherein the second electrode overlaps a middle point of the domain wall displacement layer in a first direction in which the domain wall displacement layer extends, when viewed in a lamination direction.

22. The domain wall displacement element according to claim 1, wherein an insulating layer covering a first side surface on the second magnetization fixed layer side of the first magnetization fixed layer and an insulating layer covering a second side surface on an opposite side to the first side surface are different in material.

23. The domain wall displacement element according to claim 1, wherein a thickness of the domain wall displacement layer is thicker at a contact portion that is in direct or indirect contact with the first magnetization fixed layer or the second magnetization fixed layer than at an intermediary point of two of the contact portions.

24. The domain wall displacement element according to claim 1, wherein the second magnetization fixed layer has a non-magnetic fourth intermediate layer, and the fourth intermediate layer contains the same materials as the first intermediate layer.

25. The domain wall displacement element according to claim 1, further comprising:

a conductive layer in contact with a surface of the domain wall displacement layer, the surface being on an opposite side to the non-magnetic layer.

26. A magnetic array comprising:

the plurality of domain wall displacement elements according to claim 1.

* * * * *